(12) United States Patent
Park et al.

(10) Patent No.: US 10,749,141 B2
(45) Date of Patent: Aug. 18, 2020

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Jungsun Park, Yongin-si (KR); Hyunsung Bang, Yongin-si (KR); Duckjung Lee, Yongin-si (KR); Jiyoung Choung, Yongin-si (KR); Arong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/260,116

(22) Filed: Jan. 29, 2019

(65) Prior Publication Data
US 2019/0157615 A1    May 23, 2019

Related U.S. Application Data

(62) Division of application No. 15/465,536, filed on Mar. 21, 2017, now Pat. No. 10,205,124.

(30) Foreign Application Priority Data

Jun. 10, 2016 (KR) .......................... 10-2016-0072692

(51) Int. Cl.
    *H01L 51/52* (2006.01)
    *H01L 27/32* (2006.01)
(52) U.S. Cl.
    CPC ...... *H01L 51/5253* (2013.01); *H01L 27/3246* (2013.01); *H01L 51/5225* (2013.01); *H01L 51/5228* (2013.01)

(58) Field of Classification Search
    CPC ..... H01L 51/524–5256; H01L 27/3426; H01L 27/3248
    See application file for complete search history.

(56) References Cited

U.S. PATENT DOCUMENTS 9,728,590 B2 * 8/2017 Takashige ........... H01L 51/0005
2005/0001963 A1   1/2005 Yokoyama
(Continued)

FOREIGN PATENT DOCUMENTS

JP    2002-170669    6/2002
JP    2006-318776    11/2006
(Continued)

OTHER PUBLICATIONS

Non-Final Office Action dated Jan. 25, 2018, issued in U.S. Appl. No. 15/465,536.
(Continued)

*Primary Examiner* — Stephen M Bradley
(74) *Attorney, Agent, or Firm* — H. C. Park & Associates, PLC

(57) ABSTRACT

A method of manufacturing an organic light-emitting display apparatus includes: forming a pixel electrode on a substrate; forming a pixel-defining layer (PDL) having an opening exposing at least a part of the pixel electrode; forming an intermediate layer including a central portion disposed on the pixel electrode, an edge portion that extends from the central portion and contacts the PDL, at least one common layer, and an organic emission layer; forming a protective layer including a central portion disposed on the central portion of the intermediate layer and an edge portion that extends from the central portion of the protective layer and contacts the PDL; and forming an opposite electrode on the PDL, the opposite electrode having an opening exposing (Continued)

at least a part of the protective layer and electrically connected to the protective layer.

9 Claims, 20 Drawing Sheets

(56) References Cited

U.S. PATENT DOCUMENTS

| | | | |
|---|---|---|---|
| 2006/0273712 A1 | 12/2006 | Yaegashi | |
| 2013/0075708 A1* | 3/2013 | Kurihara | H01L 51/5012 257/40 |
| 2013/0161656 A1 | 6/2013 | Choi et al. | |
| 2014/0061603 A1* | 3/2014 | Kim | H01L 51/5253 257/40 |
| 2014/0145156 A1* | 5/2014 | Choi | H01L 27/32 257/40 |
| 2016/0197313 A1 | 7/2016 | Park et al. | |
| 2017/0256754 A1* | 9/2017 | Defranco | H01L 27/3218 |

FOREIGN PATENT DOCUMENTS

| | | |
|---|---|---|
| JP | 2008-085200 | 4/2008 |
| KR | 10-2008-0025500 | 3/2008 |
| WO | 2008/038588 | 4/2008 |

OTHER PUBLICATIONS

Final Office Action dated Jun. 26, 2018, issued in U.S. Appl. No. 15/465,536.

Notice of Allowance dated Sep. 25, 2018, issued in U.S. Appl. No. 15/465,536.

* cited by examiner

ORGANIC LIGHT-EMITTING DISPLAY APPARATUS AND METHOD OF MANUFACTURING THE SAME

CROSS-REFERENCE TO RELATED APPLICATIONS

This application is a Divisional of U.S. patent application Ser. No. 15/465,536, filed on Mar. 21, 2017, and claims priority from and the benefit of Korean Patent Application No. 10-2016-0072692, filed on Jun. 10, 2016, each of which is hereby incorporated by reference for all purposes as if fully set forth herein.

BACKGROUND

Field

Exemplary embodiments relate to an organic light-emitting display apparatus and a method of manufacturing the same.

Discussion of the Background

Organic light-emitting display apparatuses are self-emissive display apparatuses and each include an organic light-emitting device (OLED) including a hole injection electrode, an electron injection electrode, and an organic emission layer formed therebetween. Organic light-emitting display apparatuses generate light when excitons, generated by combining holes injected from the hole injection electrode with electrons injected from the electron injection electrode in the organic emission layer, fall to ground states from excited states.

A fine metal mask (FMM) is generally used for depositing the above-described organic emission layer onto a substrate. However, because there are drawbacks such as an increase in manufacturing costs, an alternative deposition technology is required. Moreover, alternative deposition technologies via photo patterning processes result in OLED with low light characteristics (e.g., low luminance) compared to desired OLED light characteristics.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include an organic light-emitting display apparatus that may reduce or eliminate a problem related to light characteristics lowered (e.g., lower luminance) due to residual material being placed over a light emitting material in an intermediate layer, and a method of manufacturing the same. However, this objective is only illustrative, and the scope of embodiments is not limited thereby.

Additional aspects will be set forth in part in the description which follows and, in part, will be apparent from the description, or may be learned by practice of the inventive concept.

According to one or more embodiments, an organic light-emitting display apparatus includes a substrate, a pixel electrode disposed on the substrate, a pixel-defining layer (PDL) disposed on the pixel electrode and having an opening exposing at least a part of the pixel electrode, an intermediate layer, a protective layer, and an opposite electrode be disposed on the PDL and having an opening exposing at least a part of the protective layer, wherein the opposite electrode is electrically connected to the protective layer. The intermediate layer may include a central portion disposed on the pixel electrode, an edge portion that extends from the central portion and contacts the PDL, at least one common layer, and an organic emission layer. The protective layer may include a central portion disposed on the central portion of the intermediate layer and an edge portion that extends from the central portion of the protective layer.

According to an exemplary embodiment, a method of manufacturing an organic light-emitting display apparatus includes forming a pixel electrode on a substrate, forming a pixel-defining layer (PDL) having an opening exposing at least a part of the pixel electrode, forming an intermediate layer, forming a protective layer including a central portion disposed on the central portion of the intermediate layer and an edge portion that extends from the central portion of the protective layer and contacts the PDL, and forming an opposite electrode on the PDL. The intermediate layer may include a central portion disposed on the pixel electrode, an edge portion that extends from the central portion and contacts the PDL, at least one common layer, and an organic emission layer. The opposite electrode may have an opening exposing at least a part of the protective layer and electrically connected to the protective layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
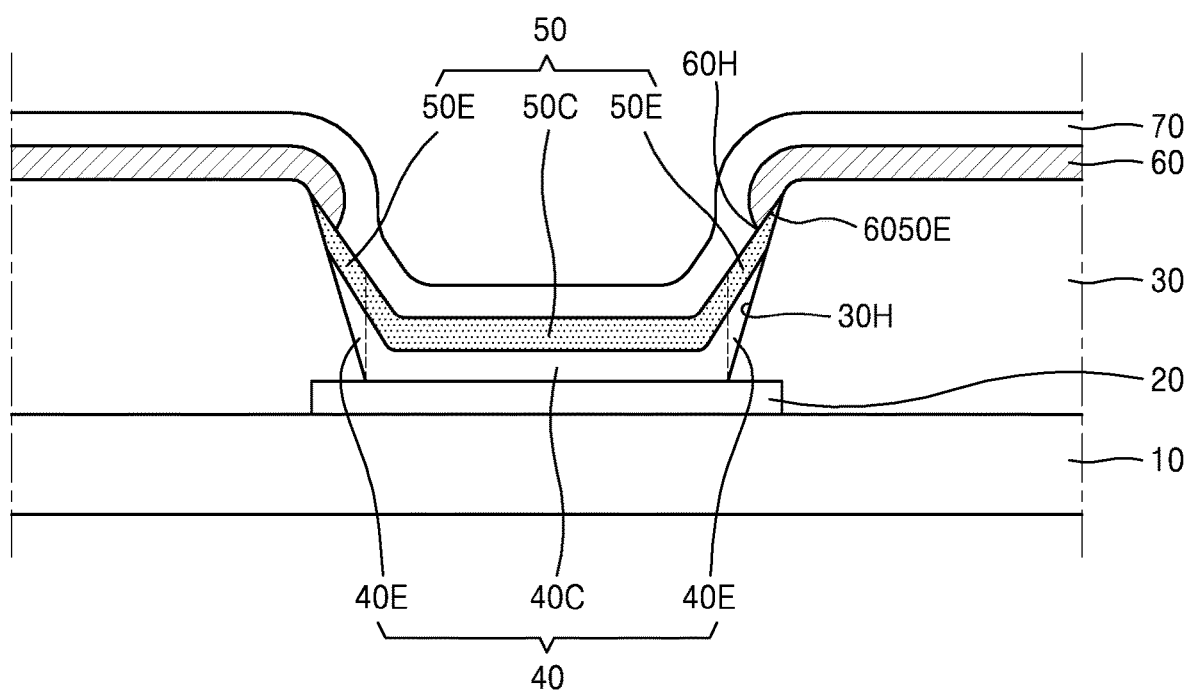
FIG. 1 is a cross-sectional view schematically illustrating an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

When an OLED is manufactured by a photo patterning process, which is typically less costly than manufacturing an OLED using a fine metal mask, protective layers that cover an intermediate layer, including an organic emission layer, function as first cathode electrodes. These protective layers are independently formed by several unit processes. Because the protective layers are independently formed, an opposite electrode, functioning as a second cathode electrode, must be deposited to electrically connect the multiple independent protective layers together. In other words, a cathode electrode is deposited twice as individual protective layers and as an interconnect covering the individual protective layers and electrically connecting the individual protective layers together. Unfortunately, because the cathode electrode is deposited twice over the intermediate layer, the resultant OLED suffers from a reduction in desired light characteristics. In particular, the resultant OLED suffers from reduced luminance or brightness (light characteristics) because light emitted from the intermediate layer must travel through an extra cathode electrode (i.e., from the opposite electrode) layer placed on top of the cathode electrode of the protective layer.

Exemplary embodiments below describe an OLED device and manufacturing method, which is less costly than a conventional OLED made using a fine metal mask, but does not suffer from the same low luminance that an OLED typically suffers from when manufactured using a photo patterning process. Exemplary embodiments describe an OLED, made by photo pattering processes, that does not have an opposite electrode disposed over a central portion of the light emitting intermediate layer.

Figure 2:
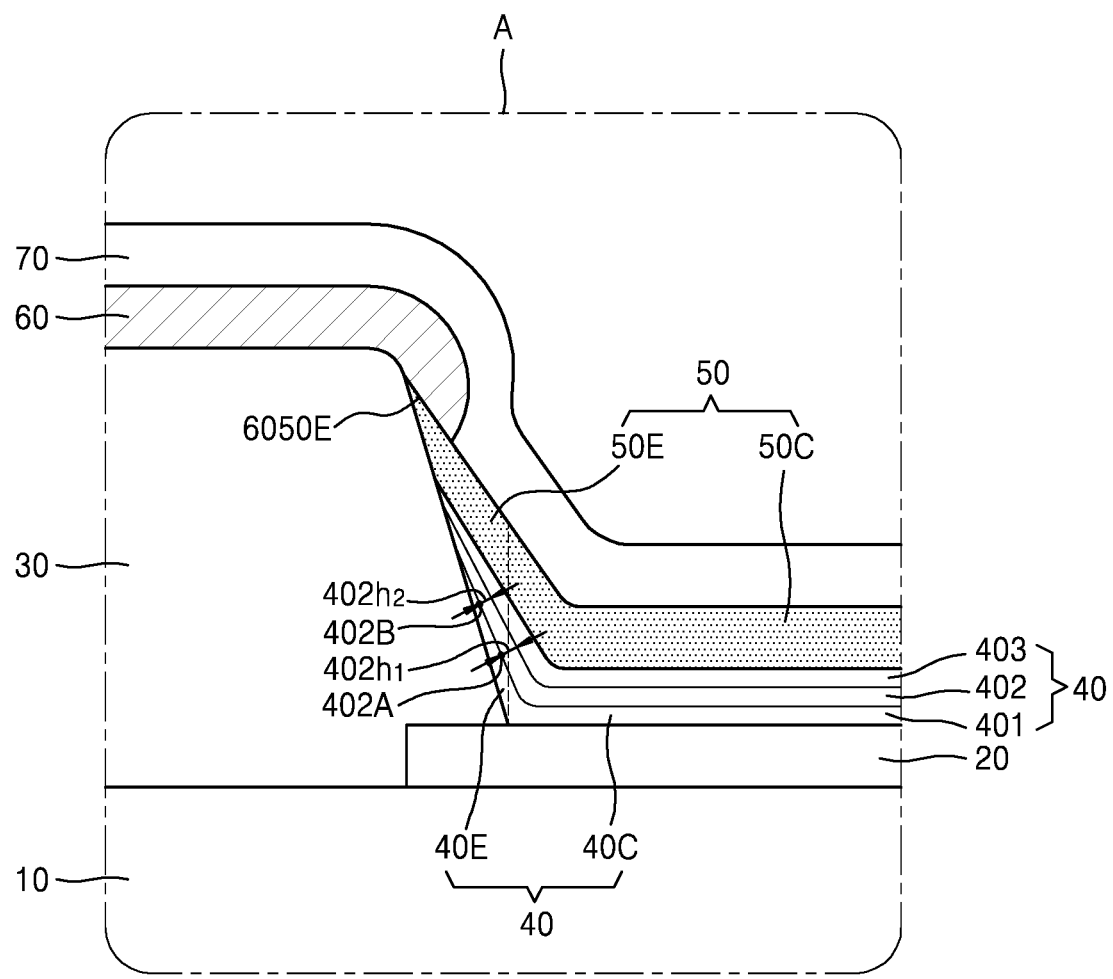
FIG. 2 is an enlarged cross-sectional view of portion A of FIG. 1.
Figure 3:
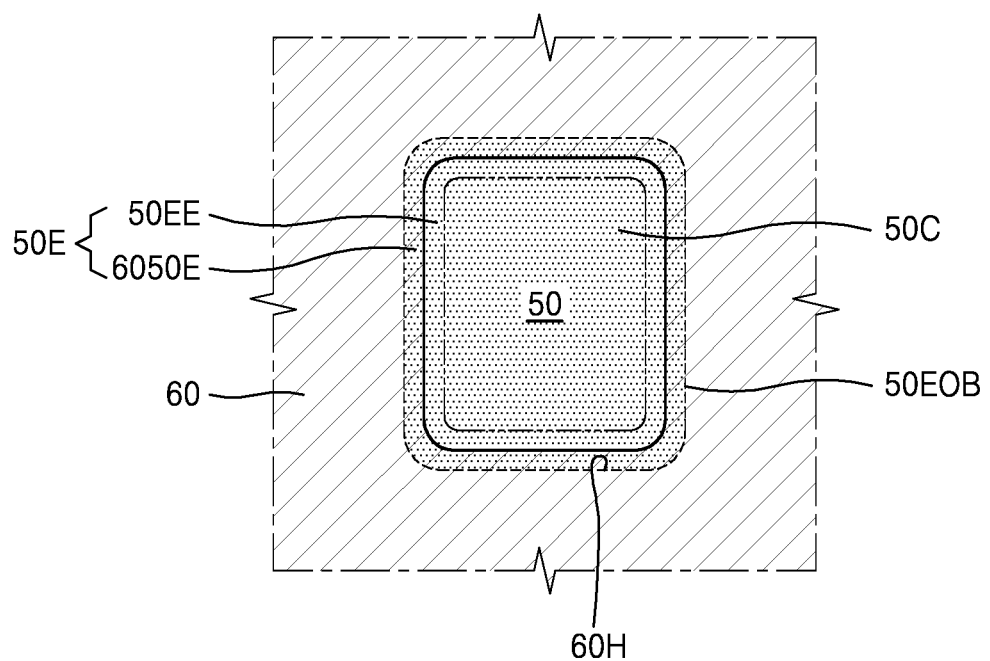
FIG. 3 is a plan view of the organic light-emitting display apparatus illustrated in FIG. 1.

FIG. 1 is a cross-sectional view schematically illustrating an organic light-emitting display apparatus according to an exemplary embodiment, FIG. 2 is an enlarged cross-sectional view of portion A of FIG. 1, and FIG. 3 is a plan view of the organic light-emitting display apparatus illustrated in FIG. 1.

Referring to FIGS. 1 through 3, the organic light-emitting display apparatus according to an exemplary embodiment may include a substrate 10, a pixel electrode 20 disposed on the substrate 10, a pixel-defining layer (PDL) 30 disposed on the pixel electrode 20 and having an opening 30H exposing at least a part of the pixel electrode 20, an intermediate layer 40 including a central portion 40C (i.e., the intermediate layer central portion 40C) disposed on the pixel electrode 20, an edge portion 40E (i.e., the intermediate layer edge portion 40E) that extends from the intermediate layer central portion 40C and contacts the PDL 30, at least one common layer, an organic emission layer 402, a protective layer 50 including a central portion 50C (i.e., the protective layer central portion 50C) disposed on the intermediate layer central portion 40C and an edge portion 50E (i.e., the protective layer edge portion 50E) extending from the protective layer central portion 50C, and an opposite electrode 60 that is disposed on the PDL 30, has an opening 60H exposing at least a part of the protective layer 50, and is electrically connected to the protective layer 50.

The substrate 10 may be formed of various materials. For example, the substrate 10 may be formed of a glass material, a metal material, a plastic material, etc. A buffer layer (not shown) may be disposed on the substrate 10, the buffer layer including an inorganic material, such as silicon oxide, silicon nitride and/or silicon oxynitride. The buffer layer (not shown) may improve a smoothness of a top surface of the substrate 10, prevent impurities from the substrate 10 from permeating into an active layer of a thin film transistor (TFT) (not shown) or minimize permeation thereof. The buffer layer may be omitted according to circumstances.

The TFT (not shown) may be disposed on the substrate 10 to control whether a pixel emits light. The TFT may include an active layer including a semiconductor material, such as amorphous silicon, polycrystalline silicon, an oxide semiconductor or an organic semiconductor material, a gate electrode insulated from the active layer, and a source electrode and a drain electrode of which each is electrically connected to the active layer.

A via insulating layer (not shown) may be disposed on the TFT to cover the TFT. The via insulating layer may have a flat top surface so that the pixel electrode 20 may be flatly formed. The via insulating layer may be formed of an organic material, such as acryl, benzocyclobutene (BCB), polyimide (PI), or hexamethyldisiloxane (HMDSO), for example.

The pixel electrode 20 may be disposed on the via insulating layer to be electrically connected to the TFT. The pixel electrode 20 is disposed in each pixel to have an island shape. The pixel electrode 20 may be a reflective electrode. The pixel electrode 20 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent conductive layer disposed above and/or below the reflective layer. The transparent conductive layer may be at least one selected from the group consisting of an indium tin oxide (ITO), an indium zinc oxide (IZO), a zinc oxide (ZNO), an indium oxide ($In_2O_3$), an indium gallium oxide (IGO), and an aluminum zinc oxide (AZO).

The PDL 30 is disposed on the pixel electrode 20 and includes the opening 30H exposing at least a part of the pixel electrode 20. The PDL 30 may be formed of an organic material such as PI or HMDSO. However, embodiments are not limited thereto. The PDL 30 may include a single layer or layers.

The intermediate layer 40 including at least one common layer, i.e., first and second common layers 401 and 403 and the organic emission layer 402, is disposed on the pixel electrode 20 exposed by the PDL 30. The organic emission layer 402 may include a small molecular weight material or a polymer material, and the first common layer 401 may be disposed between the pixel electrode 20 and the organic emission layer 402, and the second common layer 403 may be disposed between the organic emission layer 402 and the protective layer 50.

FIG. 2 is an enlarged cross-sectional view of portion A of FIG. 1. The intermediate layer 40 includes the intermediate layer central portion 40C disposed on the pixel electrode 20 and the intermediate layer edge portion 40E that extends from the intermediate layer central portion 40C and contacts the PDL 30. When a line perpendicular to the substrate 10 is drawn at a point where the pixel electrode 20, the PDL 30, and the intermediate layer 40 meet each other, to divide the intermediate layer 40, an area contacting the pixel electrode 20 is referred to as the intermediate layer central portion 40C, and an area contacting the PDL 30 is referred to as the intermediate layer edge portion 40E.

In FIG. 2, each of the first common layer 401 disposed between the pixel electrode 20 and the organic emission layer 402 and the second common layer 402 disposed between the organic emission layer 402 and the protective layer 50 is a single layer. However, embodiments are not limited thereto. The first common layer 401 may be a hole injection layer (HIL) and/or a hole transport layer (HTL), and the second common layer 403 may be an electron transportation layer (ETL) and/or an electron injection layer (EIL).

According to an embodiment, the thickness of the organic emission layer 402 included in the intermediate layer edge portion 40E may be reduced away from the intermediate layer central portion 40C toward the intermediate layer edge portion 40E. In this case, a distance between one point of a lower surface of each of layers and one point where a line perpendicular to the tangent line passing through the point of the lower surface meets the upper surface of each layer is referred to as a thickness at the points.

Referring to FIG. 2, the thickness of the organic emission layer 402 disposed at the intermediate layer edge portion 40E may be reduced away from the intermediate layer central portion 40C. That is, reference numeral $402h_2$ may be less than reference numeral $402h_1$. Similarly, the thickness of the first common layer 401 and the second common layer 403 disposed at the intermediate layer edge portion 40E may be reduced away from the intermediate layer central portion 40C.

The protective layer 50 is disposed on the intermediate layer 40 and covers the intermediate layer central portion 40C and the intermediate layer edge portion 40E. The protective layer 50 exposes a part of the PDL 30. The protective layer 50 is disposed in each of the plurality of pixels to have an island shape. In FIG. 1, the intermediate layer 40 and the protective layer 50 are disposed only within the opening 30H of the PDL 30. However, according to another embodiment, the intermediate layer 40 and the protective layer 50 may extend from the inside of the opening 30H of the PDL 30 to a top surface of the PDL 30. That is, the intermediate layer 40 and/or the protective layer 50 may contact the top surface of the PDL 30.

The protective layer 50 includes the protective layer central portion 50C disposed on the intermediate layer central portion 40C and the protective layer edge portion 50E extending from the protective layer central portion 50C. The intermediate layer central portion 40C and the protective layer central portion 50C may be an area included in the pixels defined by the PDL 30. That is, the protective layer central portion 50C is an area that overlaps the intermediate layer central portion 40C, and the protective layer edge portion 50E is an area that overlaps the intermediate layer edge portion 40E. Light emitted from the organic emission layer 402 included in the intermediate layer 40 may be emitted to the outside through the protective layer central portion 50C.

The opposite electrode 60 is disposed on the protective layer 50 and the PDL 30 exposed by the protective layer 50. The opposite electrode 60 includes an opening 60H exposing at least a part of the protective layer 50, and is electrically connected to the protective layer 50. The opposite electrode 60 may be formed as a single body in all of the pixels, unlike the pixel electrode 20.

According to an exemplary embodiment, the opposite electrode 60 includes an area 6050E that covers at least a part of the protective layer edge portion 50E and contacts the protective layer edge portion 50E directly. That is, the protective layer central portion 50C may not be covered by the opposite electrode 60.

Referring to FIG. 3, the protective layer central portion 50C is exposed by the opening 60H of the opposite electrode 60. A part 50EE of the protective layer edge portion 50E may also be exposed by the opening 60H of the opposite electrode 60. Contrary to this, if the opposite electrode 60 contacts the protective layer central portion 50C, poor driving occurs due to a residual layer between the opposite electrode 60 and the protective layer 50 and accordingly, luminous efficiency may be lowered.

According to an exemplary embodiment, the opposite electrode 60 may cover the whole outer edge boundary line 50EOB of the protective layer edge portion 50E. When the opposite electrode 60 covers only a part of the outer edge boundary line 50EOB of the protective layer edge portion 50E, the opposite electrode 60 and the protective layer edge portion 50E may be electrically connected to each other. However, resistance may increase in an area where the opposite electrode 60 and the protective layer edge portion 50E do not overlap.

According to an exemplary embodiment, the protective layer 50 may be disposed in an emission area of the substrate 10 where light is emitted, the opposite electrode 60 may be disposed in a non-emission area of the substrate 10, and the protective layer 50 and the opposite electrode 60 may overlap each other partially on the PDL 30.

According to the above-described embodiments, the thickness of the opposite electrode 60 may be controlled so that a resistance of the opposite electrode 60 may be controlled. Additionally, the protective layer 50 may have a uniform thickness so that light characteristics in the emission area may be maintained and a problem related to light characteristics being lowered due to the residual layer between the protective layer 50 and the opposite electrode 60 may be reduced.

The opposite electrode 60 may be a semi-transmissive electrode or a transmissive electrode and may be formed of metal having a shape of a thin film having a thickness of several to several tens of nm so that light may transmit through the opposite electrode 60. For example, the opposite electrode 60 may include Ag, Al, Mg, lithium (Li), calcium (Ca), copper (Cu), LiF/Ca, LiF/Al, MgAg, CaAg, or a compound thereof. The opposite electrode 60 may further include a transparent conductive material, such as ITO, IZO, ZnO, $In_2O_3$, IGO, or AZO.

When, as described above, the pixel electrode 20 is a reflective electrode and the opposite electrode 60 is a semi-transmissive electrode or transmissive electrode, a top-emission type organic light-emitting display apparatus in which light emitted from the organic emission layer 402 transmits through the opposite electrode 60 and is emitted to the outside may be realized.

According to an exemplary embodiment, the protective layer 50 may be formed of the same conductive material as a material used to form the opposite electrode 60. The conductive material may include Al, Mg, Li, Ca, Cu, LiF/Ca, LiF/Al, MgAg, CaAg, or a compound thereof. In this case, the protective layer 50 may be formed of metal having a shape of a thin layer having a thickness of several or several tens of nm so that light may transmit through the protective layer 50. The protective layer 50 may further include a transparent conductive material, such as ITO, IZO, ZnO, $In_2O_3$, IGO, or AZO. If the protective layer 50 may only be formed of a conductive material, the protective layer 50 and the opposite electrode 60 may include different materials.

According to an exemplary embodiment, the protective layer 50 may include a conductive organic material.

The organic light-emitting display apparatus according to an exemplary embodiment may further include a capping layer 70 that covers the protective layer 50 and the opposite electrode 60. The capping layer 70 may contribute to the efficient emission of light, generated in the intermediate layer 40 and the organic emission layer 402, to the outside.

The capping layer 70 may increase the extraction efficiency of light emitted from an organic light-emitting device (OLED) so that luminous efficiency may be improved. In one example, the capping layer 70 may include poly(3,4-ethylenedioxythiophene) (PEDOT), 4,4'-bis[N-(3-methylphenyl)-N-phenyl amino]biphenyl (TPD), 4,4',4"-tris[(3-methylephenyl)phenyl amino]triphenylamine (m-MTDATA), 1,3,5-tris[N,N-bis(2-methylephenyl)-amino]-benzene (o-MTDAB), 1,3,5-tris[N,N-bis(3-methylphenyl)-amino]-benzene (m-MTDAT), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4"-tris(N-carbazole)triphenylamine (TCTA), 2,2',2"-(1,3,5-benzenetolyl)tris-[1-phenyl-1H-benzoimidazole](TPBI), and 3-(4-biphenyl)-4-phenyl-5-t-butylphenyl-1,2,4-triazole (TAZ).

According to an exemplary embodiment, the capping layer 70 may include an inorganic material, such as zinc oxide, titanium oxide, zirconium oxide, silicon nitride, niobium oxide, tantalum oxide, tin oxide, nickel oxide, indium nitride, or gallium nitride.

Hereinafter, a method of manufacturing the organic light-emitting display apparatus of FIG. 1 will be sequentially described with reference to FIGS. 4A through 4J.

Referring to FIGS. 4A, 4B, 4C, 4D, 4E, and 4F, the method of manufacturing an organic light-emitting display apparatus according to an exemplary embodiment includes forming the pixel electrode 20 on the substrate 10, forming the PDL 30 having the opening 30H exposing at least a part of the pixel electrode 20, forming the intermediate layer 40 including the intermediate layer central portion 40C disposed on the pixel electrode 20, the intermediate layer edge portion 40E extending from the intermediate layer central portion 40C and contacting the PDL 30, at least one common layer and the organic emission layer 402, forming the protective layer 50 including the protective layer central portion 50C disposed on the intermediate layer 40 and the protective layer edge portion 50E extending from the protective layer central portion 50C and contacting the PDL 30, and forming the opposite electrode 60 having the opening 60H exposing at least a part of the protective layer 50 and electrically connected to the protective layer 50 on the PDL 30.

Figure 4A:
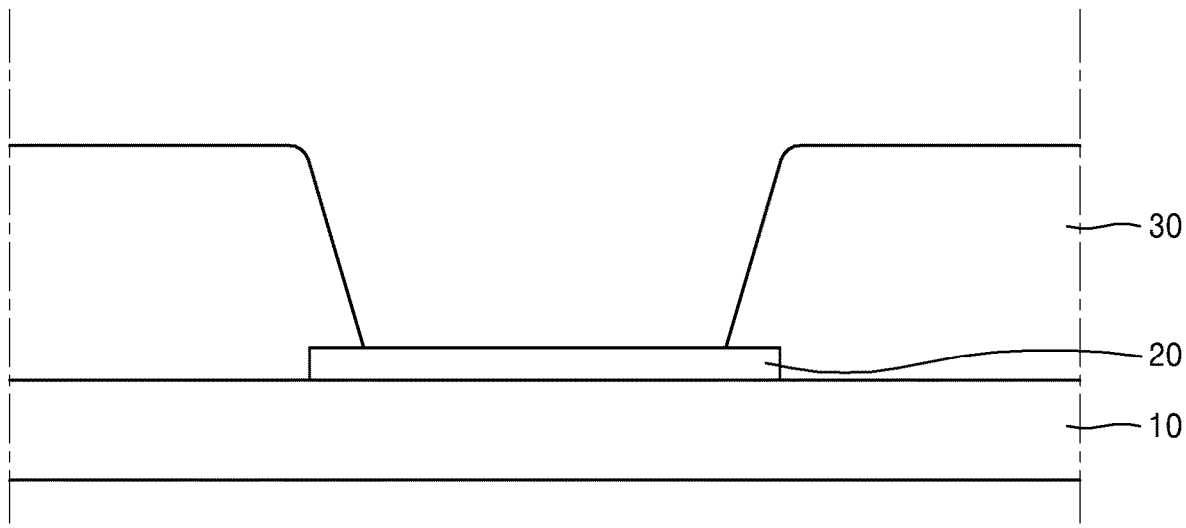
FIGS. 4A, 4B, 4C, 4D, 4E, 4F, 4G, 4H, 4I, and 4J are cross-sectional views sequentially illustrating a method of manufacturing the organic light-emitting display apparatus of FIG. 1.

Referring to FIG. 4A, the pixel electrode 20 may be formed on the substrate 10. The pixel electrode 20 may be disposed in each of the pixels to have an island shape. The pixel electrode 20 may be a reflective electrode. The pixel electrode 20 may include a reflective layer formed of Ag, Mg, Al, Pt, Pd, Au, Ni, Nd, Ir, Cr, and a compound thereof, and a transparent conductive layer disposed above and/or below the reflective layer. The transparent conductive layer may be at least one selected from the group consisting of ITO, IZO, ZnO, $In_2O_3$, IGO, and AZO.

Although not shown in FIG. 4A, before forming the pixel electrode 20, a buffer layer (not shown) may be formed on the substrate 10 and a TFT (not shown) may be formed on the buffer layer (not shown) and electrically connected to the pixel electrode 20.

Subsequently, the PDL 30 may be formed on the pixel electrode 20. The PDL 30 may cover an edge area of the pixel electrode 20 formed to have an island shape and may include the opening 30H exposing at least a part of the pixel electrode 20. That is, the PDL 30 may surround the edge area of the pixel electrode 20, and the opening 30H of the PDL 30 may expose a central portion of the pixel electrode 20 so that the PDL 30 may define the pixels.

Figure 4B:
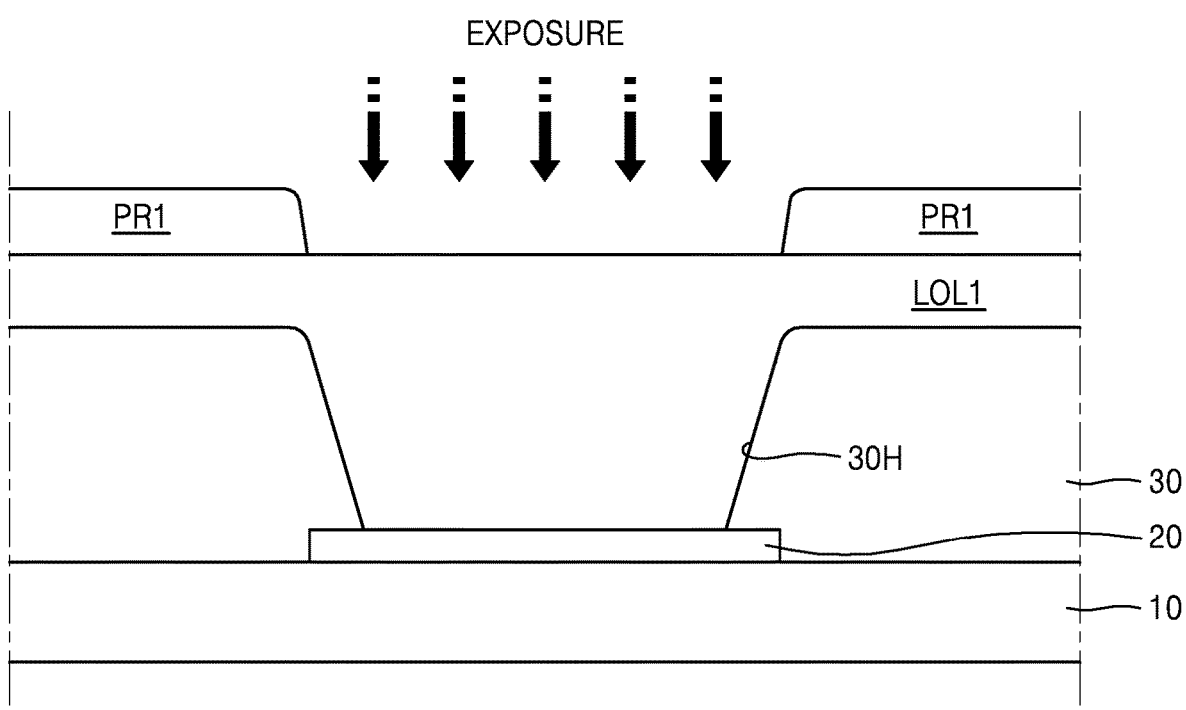

Referring to FIG. 4B, a first lift off layer LOL1 may be formed on the substrate 10 on which the pixel electrode 20 is formed. The first lift off layer LOL1 may have low chemical reactivity with the intermediate layer 40 including the organic emission layer 402 that will be formed after the PDL 30 is formed. For example, the first lift off layer LOL1 may include a fluoropolymer having low chemical reactivity with a material used to form the intermediate layer 40.

The fluoropolymer included in the first lift off layer LOL1 may be formed of a polymer including the content of fluorine (F) of 20 to 60 wt %. For example, the fluoropolymer included in the first lift off layer LOL1 may include at least one selected from the group consisting of a copolymer of polytetrafluoroethylene, polychlorotrifluoroethylene, polydichlorodifluoroethylene, chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift off layer LOL1 may be formed on the substrate 10 using a method such as coating, printing, or deposition. When the first lift off layer LOL1 is formed using coating and printing, after curing and/or polymerization is performed, a process of forming a first photoresist layer PR1 may be performed as necessary.

The thickness of the first lift off layer LOL1 may be 0.2 to 5 When the thickness of the first lift off layer LOL1 is too large, the time required for melting the first lift off layer LOL1 so as to pattern the first lift off layer LOL1 increases, and thus, a manufacturing process time may be increased. When the thickness of the first lift off layer LOL1 is too small, it is not easy to perform a lift off process.

Subsequently, the first photoresist layer PR1 may be formed on the first lift off layer LOL1. After a photoresist is coated on the whole first lift off layer LOL1, a photoresist in an area that overlaps the pixel electrode 20 may be exposed and developed using a photomask (not shown). In this case, the photoresist may be a positive type or negative type. In the following drawings, a positive-type photoresist is illustrated. Through the above process, the photoresist in the area that overlaps the pixel electrode 20 may be removed so that the first photoresist layer PR1 may be formed.

Figure 4C:
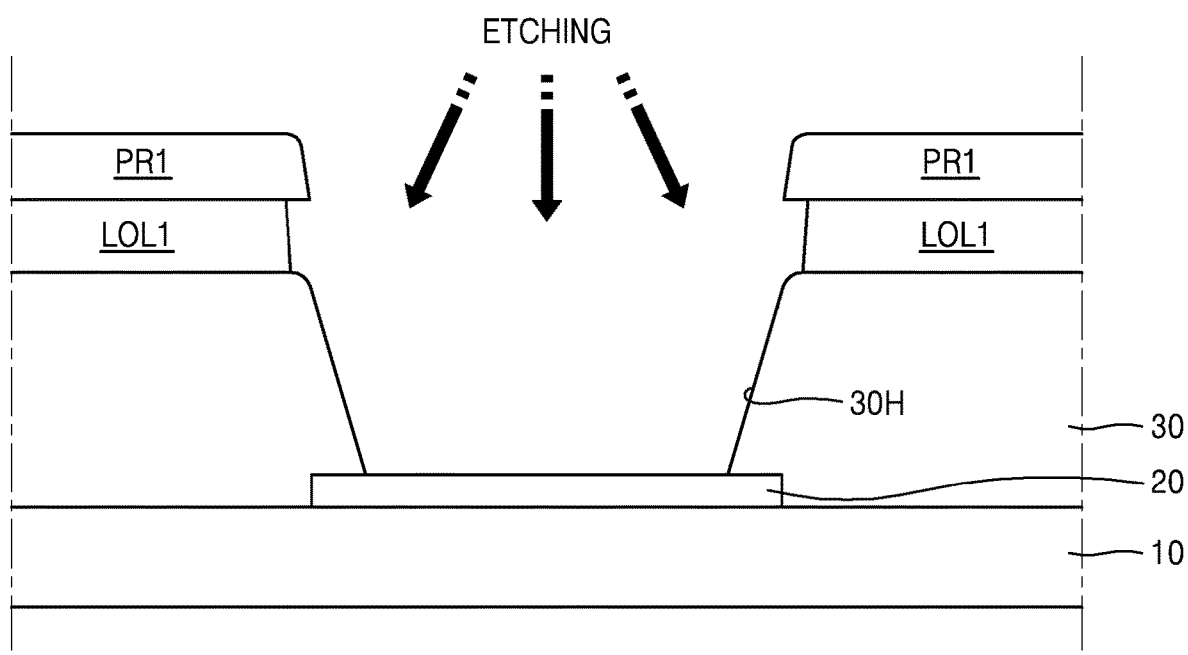

Referring to FIG. 4C, the first lift off layer LOL1 may be etched using the patterned first photoresist layer PR1 as an etching mask. When the first lift off layer LOL1 includes a fluoropolymer, a solvent that may etch the fluoropolymer may be used as an etchant. A first solvent (not shown) including F may be used as the etchant. The first solvent may include hydrofluoroether.

Through the etching process, the material used to form the first lift off layer LOL1 below an area of the developed photoresist may be removed so that a part of the pixel electrode 20 and the PDL 30 may be exposed.

Figure 4D:
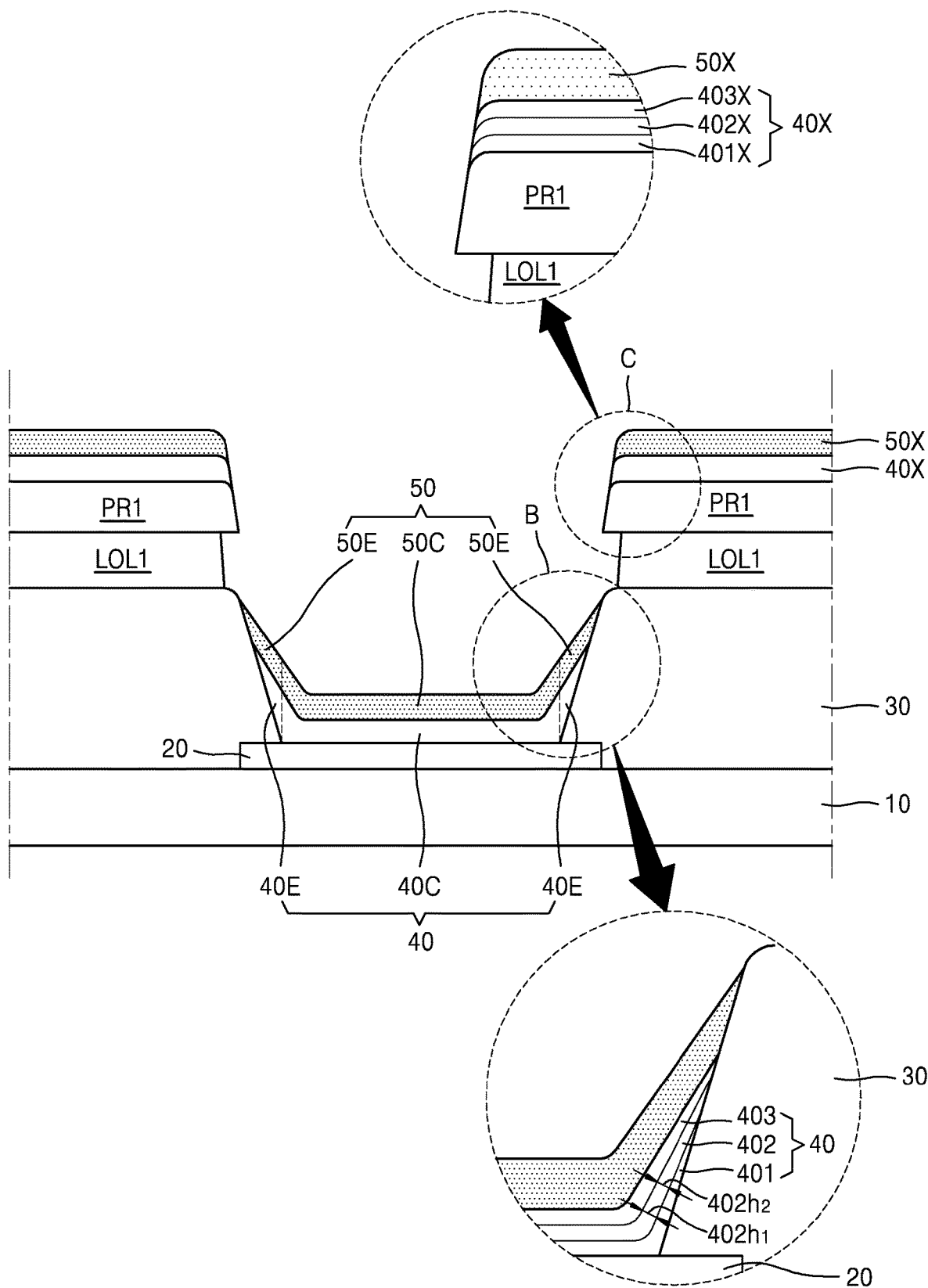

Referring to FIG. 4D, the intermediate layer 40 may be formed on the pixel electrode 20 exposed by the first lift off layer LOL1 using the first lift off layer LOL1 and the first photoresist layer PR1 as a mask, the intermediate layer 40 including the first common layer 401, the organic emission layer 402, and the second common layer 403. The first common layer 401 may be an HTL and/or an HIL, and the second common layer 403 may be an EIL and/or an ETL. However, embodiments are not limited thereto, and the first common layer 401 and the second common layer 403 may further include other functional layers. In addition, at least one of the first common layer 401 and the second common layer 403 may also be omitted.

According to an exemplary embodiment, the intermediate layer 40 may be formed in such a way that the thicknesses of the first and second common layers 401 and 403 and the organic emission layer 402 included in the intermediate layer edge portion 40E may be reduced away from the intermediate layer central portion 40C. Referring to the enlarged view of region B of FIG. 4D, the thicknesses of the first common layer 401, the organic emission layer 402, and the second common layer 403 may be reduced away from the intermediate layer central portion 40C. For example, the thickness $402h_2$ of the organic emission layer 402 far from the intermediate layer central portion 40C may be less than the thickness $401h_1$ of the organic emission layer 402 close to the intermediate layer central portion 40C.

Referring to the enlarged view of region C of FIG. 4D, a material layer 40X that constitutes the intermediate layer 40 may be stacked on the first photoresist layer PR1. The material layer 40X that constitutes the intermediate layer 40 may include a material layer 401X that constitutes the first common layer 401, a material layer 402X that constitutes the organic emission layer 402, and a material layer 403X that constitutes the second common layer 403.

Subsequently, the protective layer 50 may be formed on the intermediate layer 40 using the first lift off layer LOL1 and the first photoresist layer PR1 as a mask. The protective layer 50 may formed by vacuum deposition, like the intermediate layer 40. The protective layer 50 may completely cover the intermediate layer 40, and a material layer 50X that constitutes the protective layer 50 may also be formed over the first photoresist layer PR1.

Because the protective layer 50 may be formed using the first lift off layer LOL1 and the first photoresist layer PR1 as a mask, the protective layer 50 may not be formed in an area where the first lift off layer LOL1 is disposed. That is, the protective layer 50 may only be formed on a part of the PDL 30 and only contact a part of the PDL 30. That is, the protective layer 50 may expose a part of the PDL 30.

Figure 4E:
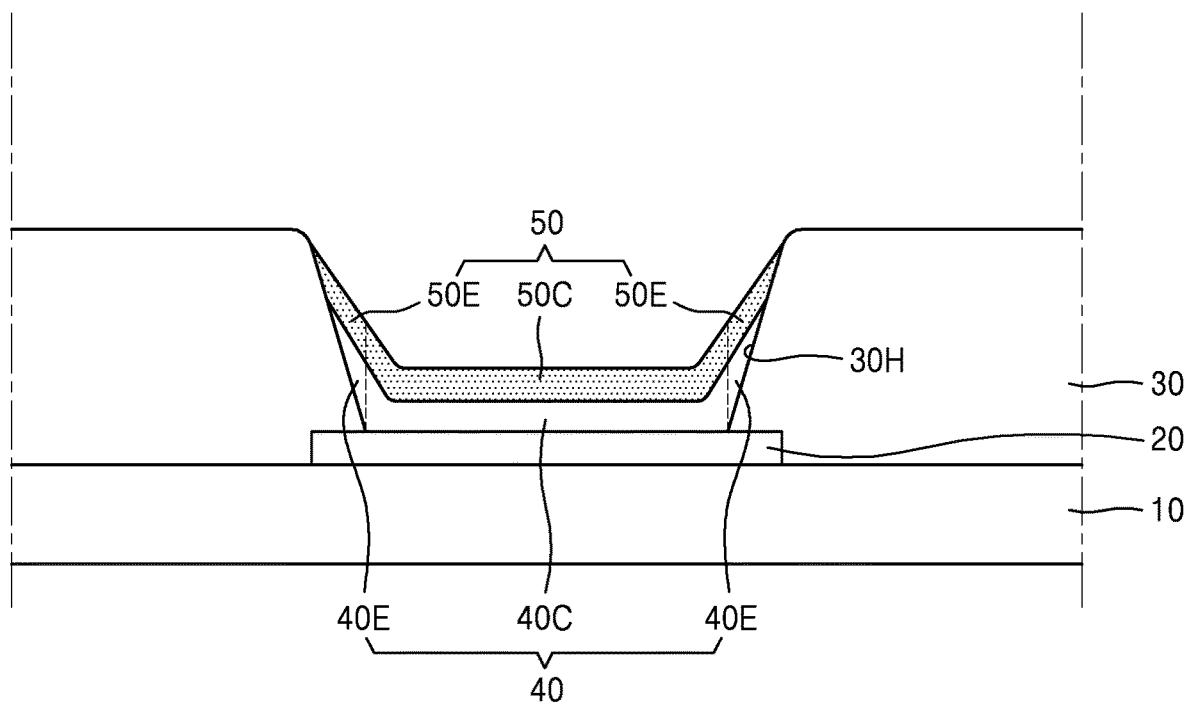

Referring to FIG. 4E, the first lift off layer LOL1 and the first photoresist layer PR1 may be removed using a stripper. For example, when the first lift off layer LOL1 includes a fluoropolymer, a second solvent (not shown) including F may be used as the stripper. In this case, because a lift off process may be performed after the intermediate layer 40 and the protective layer 50 are formed, the second solvent may be formed of a material having low chemical reactivity with the intermediate layer 40. The second solvent may include hydrofluoroether.

When the first lift off layer LOL1 is removed, the first photoresist layer PR1 formed on the first lift off layer LOL1, the material layer 40X that constitutes the intermediate layer 40, and the material layer 50X that constitutes the protective layer 50 may also removed together therewith. Through the photo patterning process of FIGS. 4A through 4E, the intermediate layer 40 and the protective layer 50 may be formed on the pixel electrode 20.

FIGS. 4F through 4I are cross-sectional views illustrating a process of forming the opposite electrode 60.

According to an exemplary embodiment, forming of the opposite electrode 60 may include, after forming the protective layer 50, forming a second lift off layer LOL2 on the PDL 30 and the protective layer 50, forming a second photoresist layer PR2 on the second lift off layer LOL2, patterning the second photoresist layer PR2, etching the second lift off layer LOL2 using the patterned second photoresist layer PR2 as a mask to expose at least a part of the PDL 30 and the protective layer edge portion 50E, forming the opposite electrode 60 including an area contacting the protective layer edge portion 50E on at least a part of the PDL 30 and the protective layer edge portion 50E, and removing the second lift off layer LOL2 and the second photoresist layer PR2.

Figure 4F:
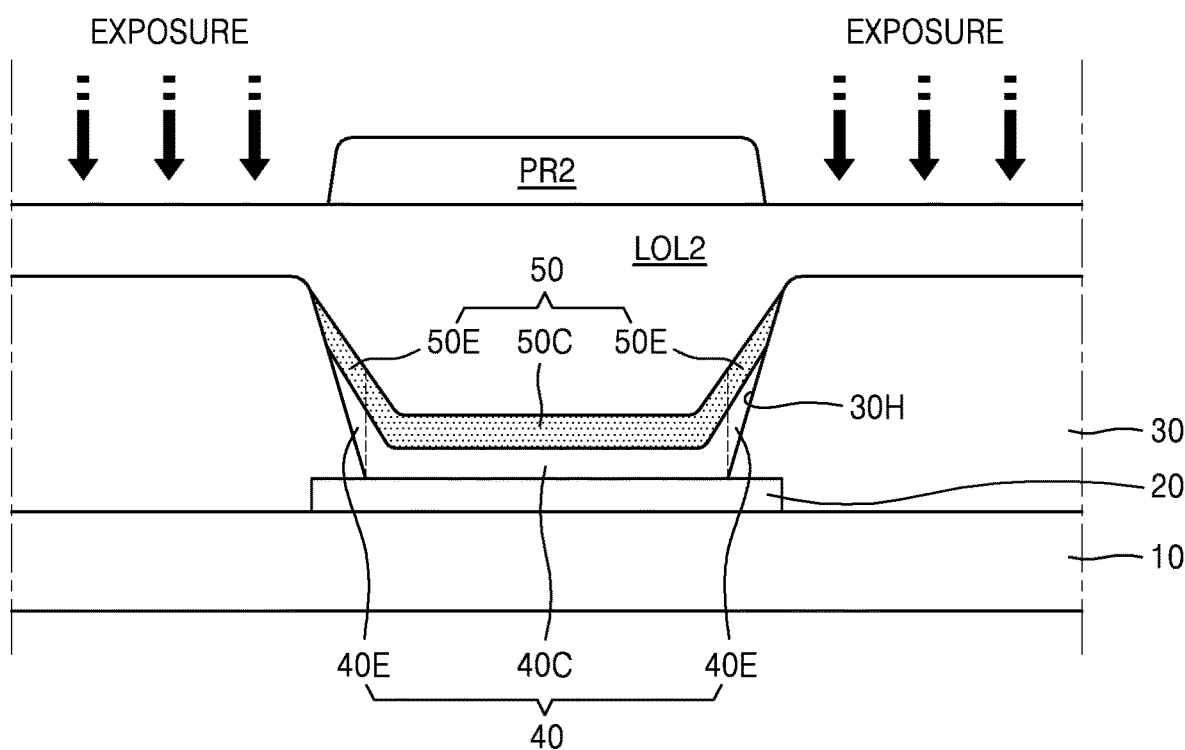

Referring to FIG. 4F, the second lift off layer LOL2 may be formed on the substrate 10, on which the intermediate layer 40 and the protective layer 50 are formed. The second lift off layer LOL2 may have low chemical reactivity with the intermediate layer 40 including the organic emission layer 402. For example, the second lift off layer LOL2 may include a fluoropolymer having low chemical reactivity with the material used to form the intermediate layer 40. The fluoropolymer is as described above.

The second lift off layer LOL2 may be formed using a method such as coating, printing, and deposition. When the second lift off layer LOL2 is formed by coating and printing, after curing and/or polymerization is performed, a process of forming the second photoresist layer PR2 may be performed as necessary.

Subsequently, the second photoresist layer PR2 may be formed on the second lift off layer LOL2. After a photoresist is coated on the whole second lift off layer LOL2, the photoresist in an area that overlaps the PDL 30 may be exposed and developed using a photomask (not shown). In this case, the photoresist may be a positive type or negative type. Through the above process, the photoresist in the area that overlaps the PDL 30 may be removed so that the second photoresist layer PR2 may be formed.

Figure 4G:
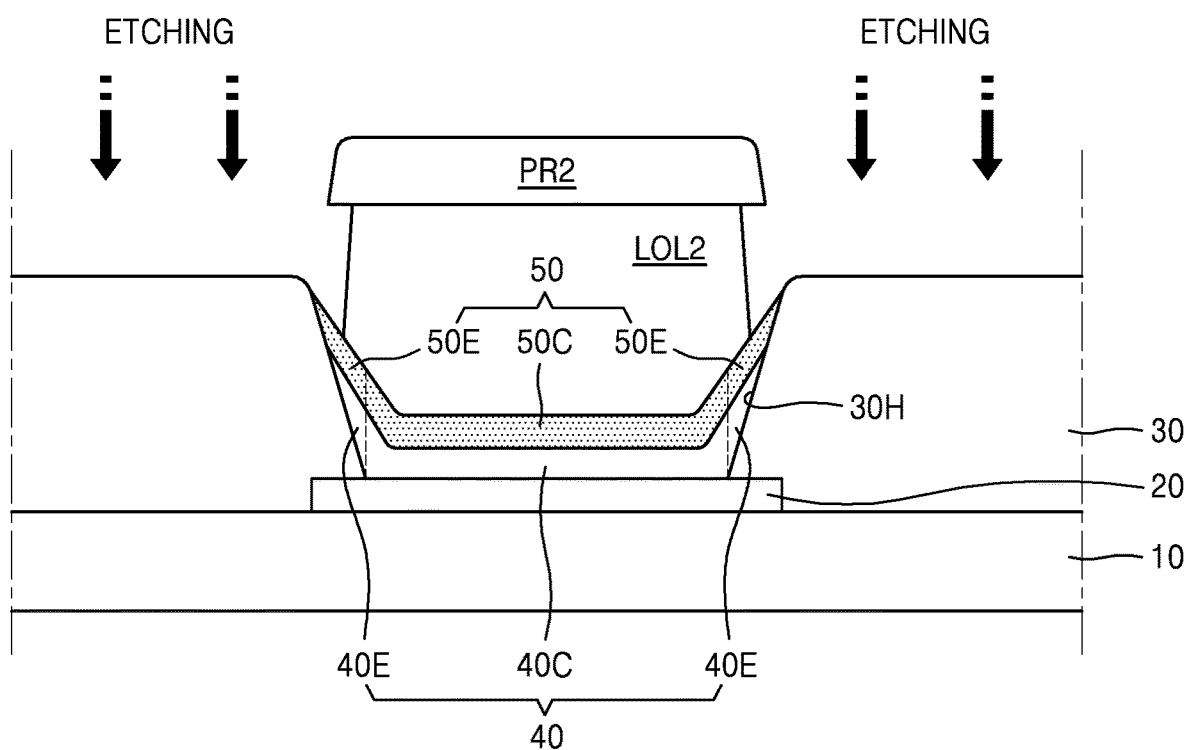

Referring to FIG. 4G, the second lift off layer LOL2 may be etched using the patterned second photoresist layer PR2 as an etching mask. When the second lift off layer LOL2 includes a fluoropolymer, a solvent that may etch the fluoropolymer is used as an etchant. For example, a third solvent (not shown) including F may be used as the etchant. The third solvent may include hydrofluoroether.

Through the above etching process, a material used to form the second lift off layer LOL2 below an area of the developed photoresist may be removed so that a part of the PDL 30 and at least a part of the protective layer edge portion 50E may be exposed.

Figure 4H:
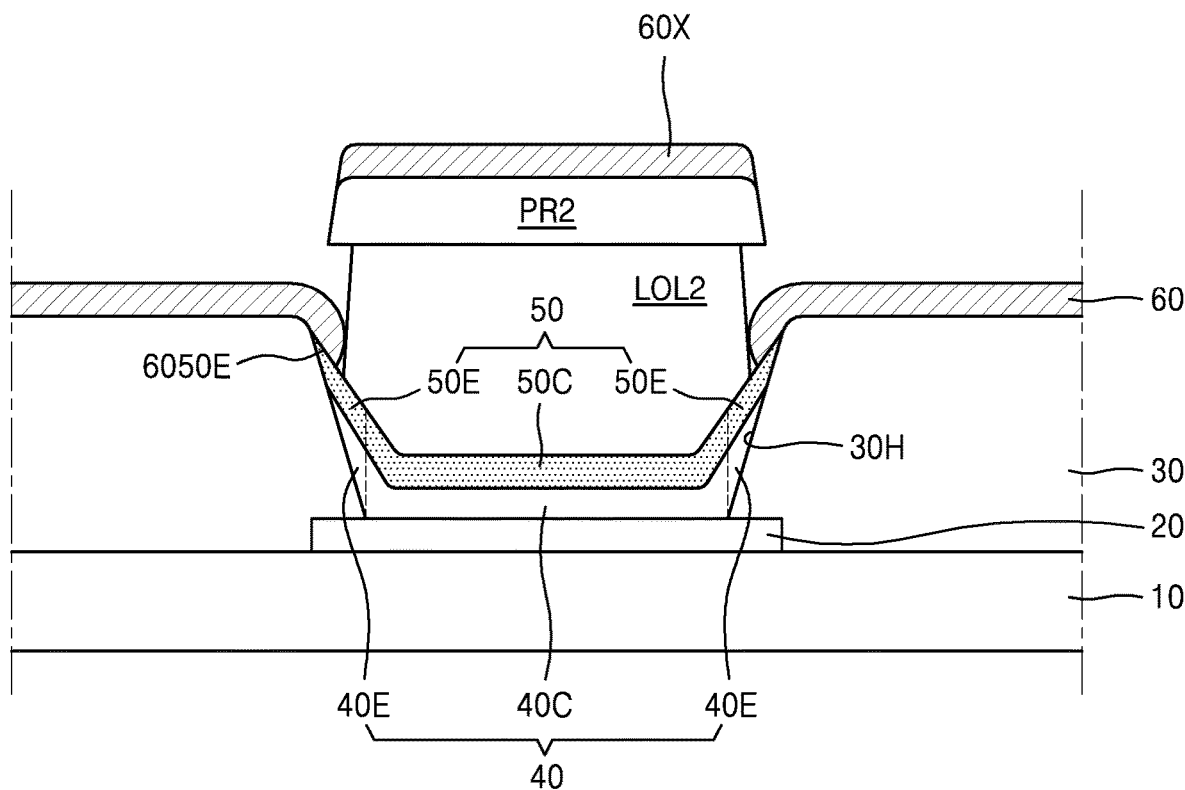

Referring to FIG. 4H, the opposite electrode 60 may be formed on the PDL 30, at least a part of the protective layer edge portion 50E, and the second photoresist layer PR2. The opposite electrode 60 may be formed by vacuum deposition. In this case, a material layer 60X that constitutes the opposite electrode 60 may be formed on the second photoresist layer PR2.

According to an exemplary embodiment, the opposite electrode 60 includes an area 6050E that covers at least a part of the protective layer edge portion 50E and contacts the protective layer edge portion 50E directly. Thus, the opposite electrode 60 and the protective layer 50 may be electrically connected to each other.

Figure 4I:
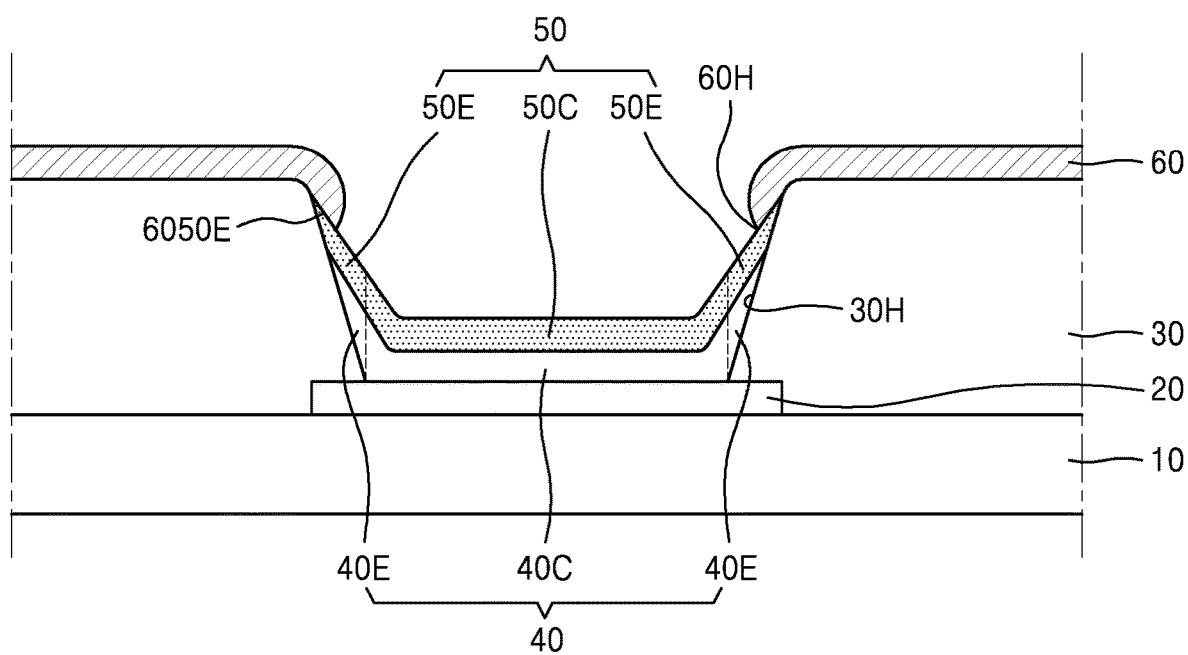

Referring to FIG. 4I, the second lift off layer LOL2 and the second photoresist layer PR2 are removed using a stripper. For example, when the second lift off layer LOL2 includes a fluoropolymer, a fourth solvent (not shown) including F may be used as the stripper. In this case, the fourth solvent may be formed of a material having low chemical reactivity with the intermediate layer 40. The fourth solvent may include hydrofluoroether.

When the second lift off layer LOL2 is removed, the second photoresist layer PR2 formed on the second lift off layer LOL2 and the material layer 60X that constitutes the opposite electrode 60 may be removed. Through the photo patterning process of FIGS. 4F through 4I, the opposite electrode 60 may be formed on at least a part of the PDL 30 and the protective layer edge portion 50E. In this case, the opposite electrode 60 may include the opening 60H exposing at least a part of the protective layer 50.

According to an exemplary embodiment, the opposite electrode 60 may be formed so that the protective layer central portion 50C may be exposed by the opening 60H of the opposite electrode 60. In this case, a part 50EE of the protective layer edge portion 50E may also be exposed by the opening 60H of the opposite electrode 60. Contrary to this, if the opposite electrode 60 contacts the protective layer central portion 50C, poor driving may occur due to the residual layer between the opposite electrode 60 and the protective layer 50, and accordingly, luminous efficiency may be lowered.

Referring back to FIG. 3, the opposite electrode 60 may cover the whole outer edge boundary line 50EOB of the protective layer edge portion 50E. When the opposite electrode 60 covers only a part of the outer edge boundary line 50EOB of the protective layer edge portion 50E, the opposite electrode 60 and the protective layer edge portion 50E may be electrically connected to each other. However, resistance may be generated in an area where the opposite electrode 60 and the protective layer edge portion 50E do not overlap.

The opposite electrode 60 may be a semi-transmissive electrode or transmissive electrode and may be formed of metal having a shape of a thin layer having a thickness of several or several tens of nm so that light may transmit through the opposite electrode 60. For example, the opposite electrode 60 may include Ag, Al, Mg, Li, Ca, Cu, LiF/Ca, LiF/Al, MgAg, CaAg, or a compound thereof. The opposite electrode 60 may further include a transparent conductive material, such as ITO, IZO, ZnO, $In_2O_3$, IGO, or AZO.

According to an exemplary embodiment, the protective layer 50 may be formed of the same conductive material as a material used to form the opposite electrode 60. The conductive material may include Al, Mg, Li, Ca, Cu, LiF/Ca, LiF/Al, MgAg, CaAg, or a compound thereof, for example. In this case, the protective layer 50 may be formed of metal having a shape of a thin layer having a thickness of several to several tens of nm so that light may transmit through the protective layer 50. The protective layer 50 may further include a transparent conductive material, such as ITO, IZO, ZnO, $In_2O_3$, IGO, or AZO. If the protective layer 50 only has to be formed of the conductive material, the protective layer 50 and the opposite electrode 60 may include different materials.

According to another embodiment, the protective layer 50 may include a conductive organic material.

As described above, when the pixel electrode 20 is a reflective electrode and the opposite electrode 60 is a semi-transmissive electrode or transmissive electrode, a top-emission type organic light-emitting display apparatus in which light emitted from the organic emission layer 402 transmits through the opposite electrode 60 and is emitted to the outside, may be provided.

Figure 4J:
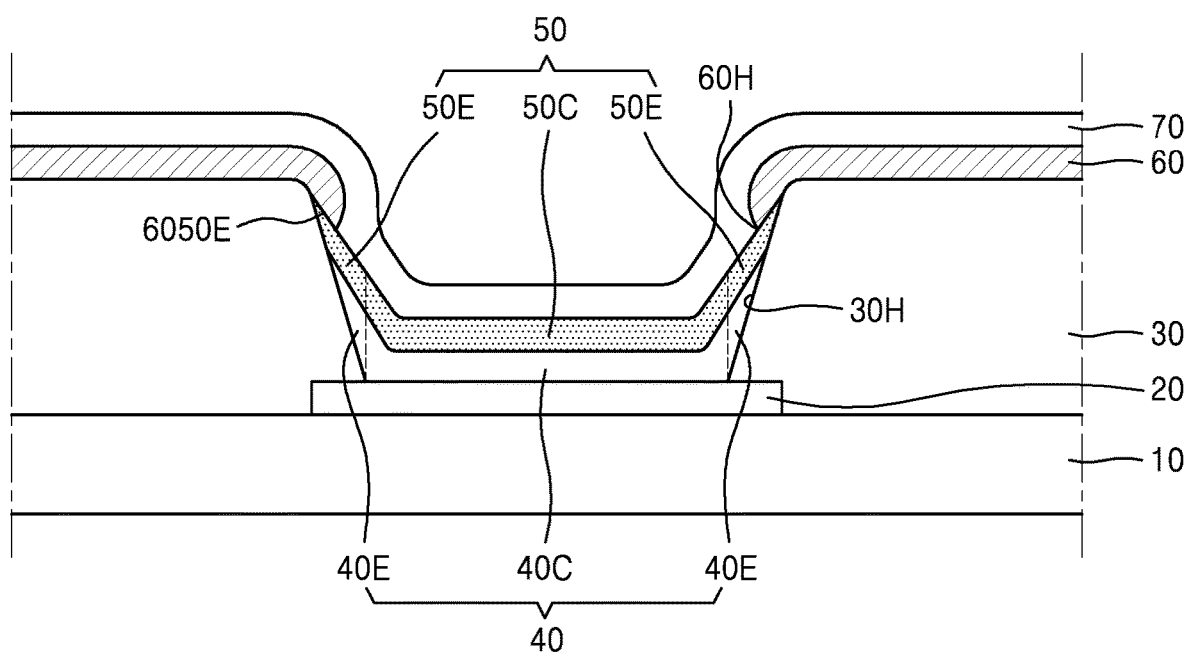

Referring to FIG. 4J, after the opposite electrode 60 is formed, capping layer 70 may be further formed on the protective layer 50 and the opposite electrode 60 and cover the protective layer 50 and the opposite electrode 60. The capping layer 70 may cover at least a part of the opposite electrode 60, the protective layer central portion 50C and the protective layer edge portion 50E. The type of materials that may be used to form the capping layer 70 is as described above. The capping layer 70 may be formed by vacuum deposition.

Figure 5:
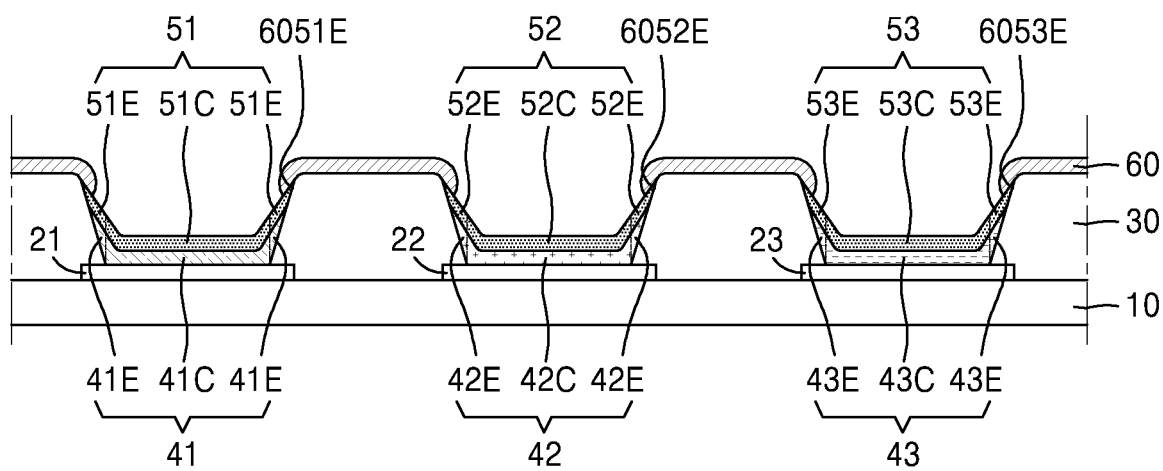
FIG. 5 is a cross-sectional view schematically illustrating an organic light-emitting display apparatus according to another embodiment.

FIG. 5 is a cross-sectional view schematically illustrating an organic light-emitting display apparatus according to another embodiment.

According to an exemplary embodiment, the pixel electrode 20 may include a first pixel electrode 21, a second pixel electrode 22, and a third pixel electrode 23, which are disposed on the substrate 10 and spaced apart from each other. The intermediate layer 40 may include a first intermediate layer 41 disposed on the first pixel electrode 21 and emitting light of a first color, a second intermediate layer 42 disposed on the second pixel electrode 21 and emitting light of a second color, and a third intermediate layer 43 disposed on the third pixel electrode 23 and emitting light of a third color. The first intermediate layer 41, the second intermediate layer 42, and the third intermediate layer 43 may be spaced apart from each other.

The first intermediate layer 41 may emit light of the first color, and the second intermediate layer 42 may emit light of the second color, and the third intermediate layer 43 may emit light of the third color. For example, the first color may be red, and the second color may be green, and the third color may be blue. However, embodiments are not limited thereto, and three colors may be combined with each other so that white light may be emitted. Meanwhile, the first intermediate layer 41, the second intermediate layer 42, or the third intermediate layer 43, may also emit white light by including an organic emission layer including several layers.

According to an exemplary embodiment, the protective layer 50 may include a first protective layer 51 that covers the first intermediate layer 41, a second protective layer 52 that covers the second intermediate layer 42, and a third protective layer 53 that covers the third intermediate layer 43. The first protective layer 51, the second protective layer 52, and the third protective layer 53 may be spaced apart from each other. Meanwhile, the opposite electrode 60 that covers at least a part of the first, second, and third protective layers 51, 52, and 53 may be formed as a single body.

According to an exemplary embodiment, the opposite electrode 60 may include areas 6051E, 6052E, and 6053E, which directly contact an edge portion 51E of the first protective layer (i.e., the first protective layer edge portion 51E), an edge portion 52E of the second protective layer (i.e., the second protective layer edge portion 52E), and an edge portion 53E of the third protective layer (i.e., the third protective layer edge portion 53E), respectively. The first, second, and third protective layer edge portions 51E, 52E, and 53E and first, second, and third protective layer central portions 51C, 52C, and 53C may be defined in a similar way to a way to define the protective layer edge portion 50E and the protective layer central portion 50C.

Figure 6:
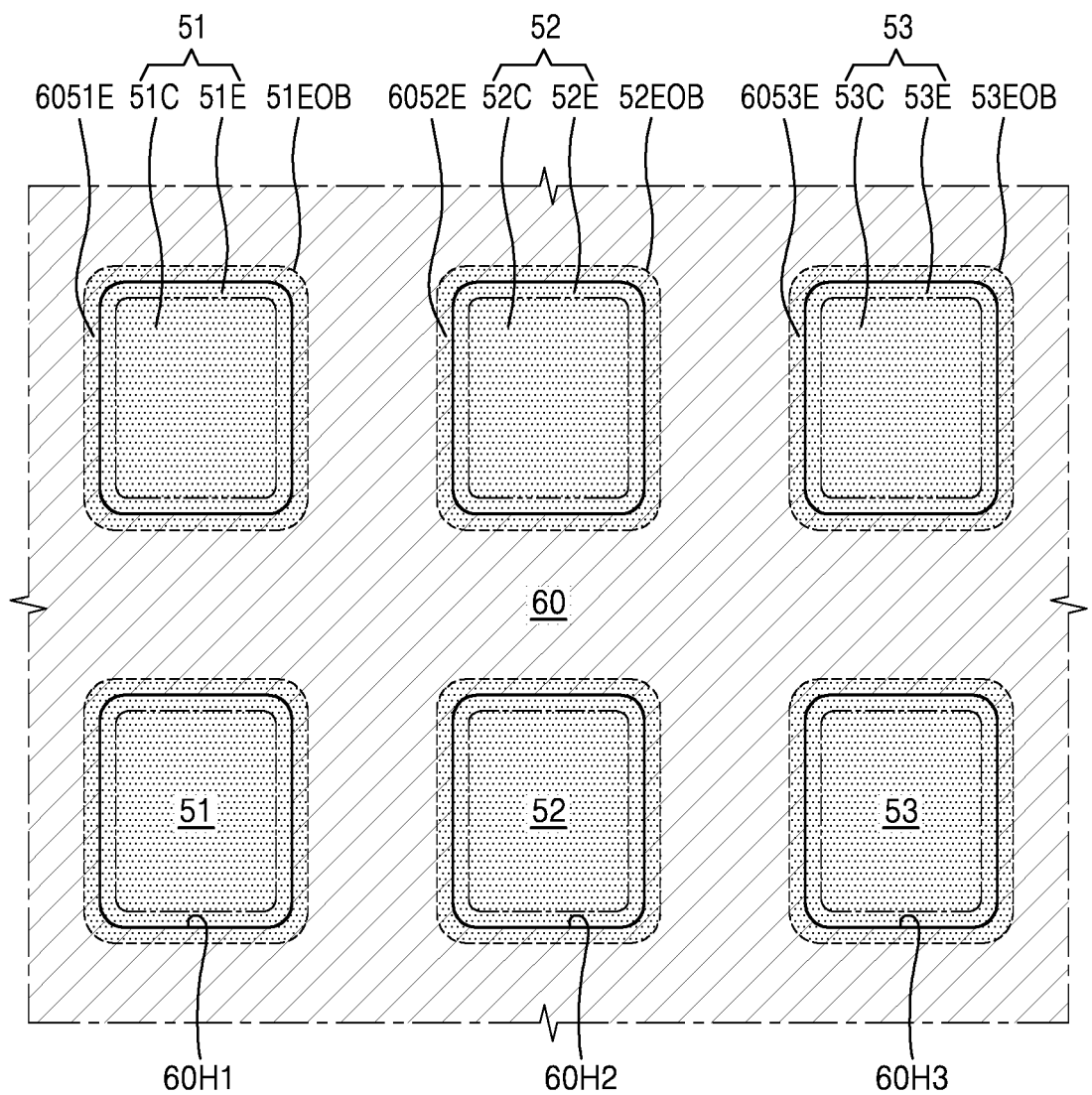
FIG. 6 is a plan view of the organic light-emitting display apparatus illustrated in FIG. 5.

FIG. 6 is a plan view of the organic light-emitting display apparatus of FIG. 5.

Referring to FIG. 6, an opening of the opposite electrode 60 may include a first opening 60H1 exposing a first protective layer central portion 51C, a second opening 60H2 exposing a second protective layer central portion 52C, and a third opening 60H3 exposing a third protective layer central portion 53C. If the opposite electrode 60 contacts the first, second, and third protective layer central portions 51C, 52C, and 53C, poor driving may occur due to the residual layer between the first, second, and third protective layers 51, 52, and 53 and luminous efficiency may be lowered.

According to an exemplary embodiment, the opposite electrode 60 may include areas 6051E, 6052E, and 6053E, which respectively contact the first protective layer edge portion 51E directly, the second protective layer edge portion 52E, and the third protective layer edge portion 53E, so that an outer edge boundary line 51EOB of the first protective layer edge portion 51E, an outer edge boundary line 52EOB of the second protective layer edge portion 52E, and an outer edge boundary line 53EOB of the third protective layer edge portion 53E may not be exposed. When the opposite electrode 60 covers only a part of the outer edge boundary lines 51EOB, 52EOB, and 53EOB of the first, second, and third protective layer edge portions 51E, 52E, and 53E, the opposite electrode 60 and the first, second, and third protective layer edge portions 51E, 52E, and 53E of the first, second, and third protective layers 51, 52, and 53 may be electrically connected to each other. However, resistance may be generated in an area where the opposite electrode 60 and the first, second, and third protective layer edge portions 51E, 52E, and 53E of the first, second, and third protective layers 51, 52, and 53 do not overlap.

FIGS. 7A through 7E are cross-sectional views sequentially illustrating a method of manufacturing the organic light-emitting display apparatus of FIG. 5.

According to an exemplary embodiment, forming the pixel electrode 20 on the substrate 10 includes forming the first pixel electrode 21, the second pixel electrode 22 and the third pixel electrode 23 on the substrate 10 and spaced apart from each other, and depositing the intermediate layer 40 and the protective layer 50 includes depositing the first intermediate layer 41 that emits light of a first color, depositing the first protective layer 51 that covers the first intermediate layer 41, depositing the second intermediate layer 42 that emits light of a second color, depositing the second protective layer 52 that covers the second intermediate layer 42, depositing the third intermediate layer 43 that emits light of a third color, and depositing the third protective layer 53 that covers the third intermediate layer 43, and the first, second, and third intermediate layers 41, 42, and 43 are spaced apart from each other, and the first, second, and third protective layers 51, 52, and 53 are spaced apart from each other.

Figure 7A:
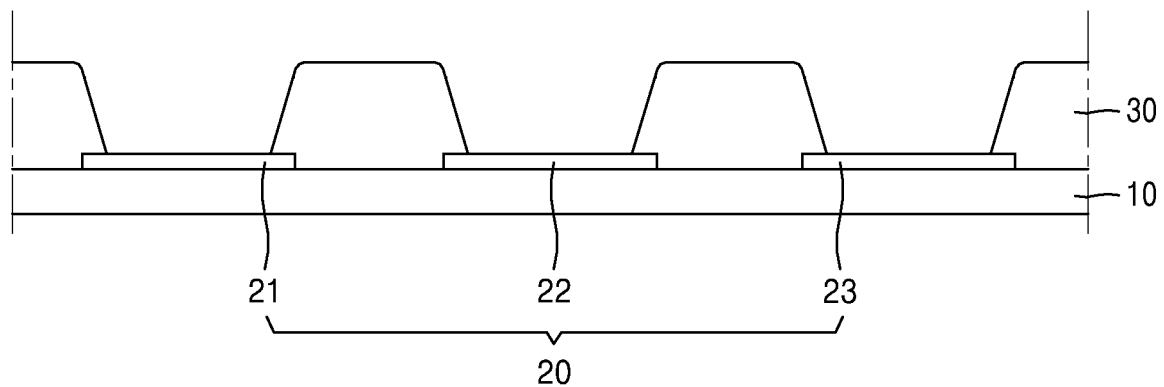
FIGS. 7A, 7B, 7C, 7D, and 7E are cross-sectional views sequentially illustrating a method of manufacturing the organic light-emitting display apparatus of FIG. 5.
Figure 7B:
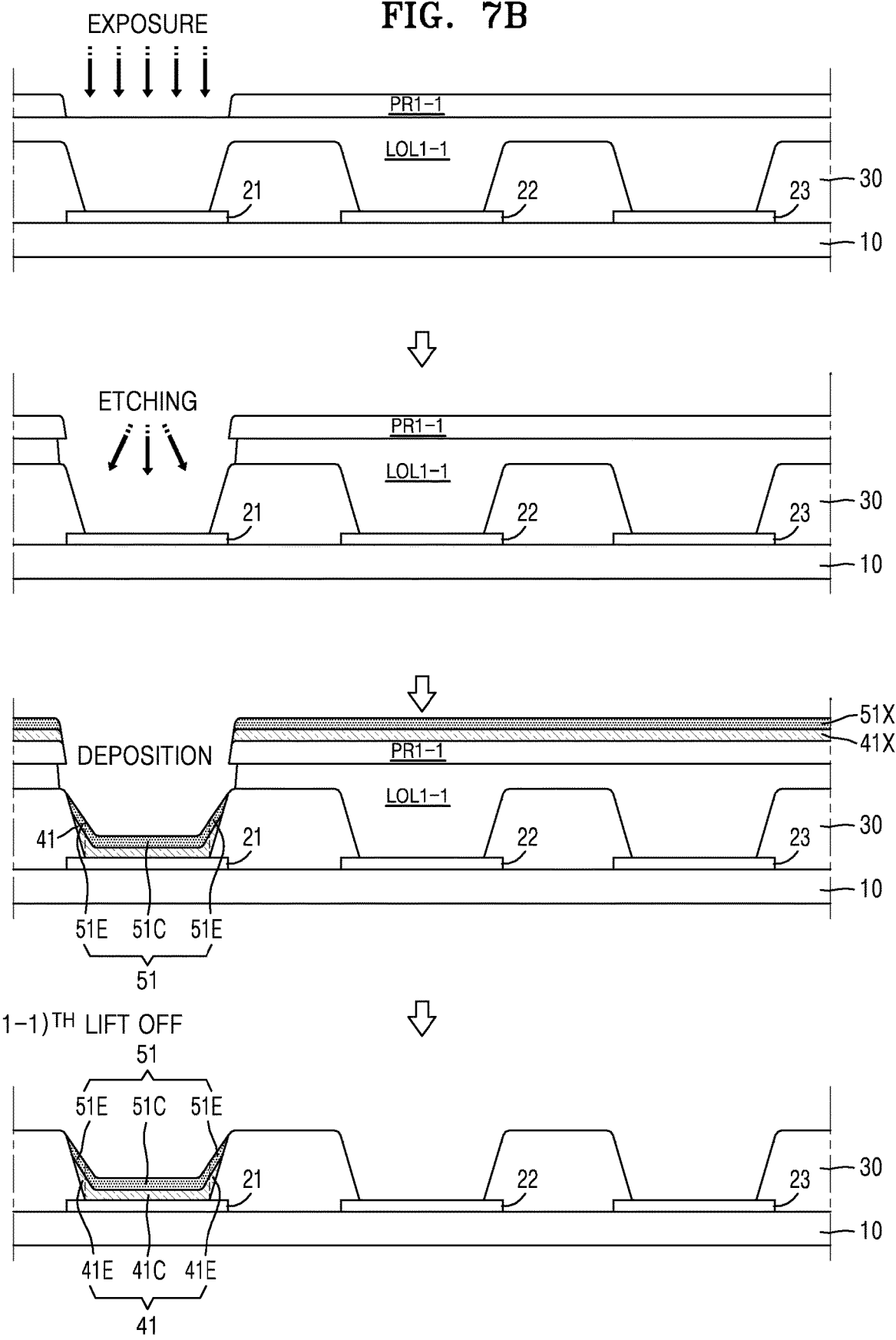

FIGS. 7A and 7B are schematic cross-sectional views illustrating a process of forming the pixel electrode 20, the PDL 30, the first intermediate layer 41, and the first protective layer 51.

Referring to FIG. 7A, the pixel electrode 20 may be formed on the substrate 10. The pixel electrode 20 may include the first, second, and third pixel electrodes 21, 22, and 23, which may be spaced apart from each other. Although not shown in FIG. 7A, the first, second, and third pixel electrodes 21, 22, and 23 may be electrically connected to first, second, and third TFTs (not shown) disposed between the substrate 10 and the first, second, and third pixel electrodes 21, 22, and 23. Subsequently, the PDL 30 that exposes at least a part of the first, second, and third pixel electrodes 21, 22, and 23 may be formed on the substrate 10 on which the first, second, and third pixel electrodes 21, 22, and 23 are formed.

FIG. 7B is a schematic cross-sectional view illustrating a first unit process of forming the first intermediate layer 41 and the first protective layer 51.

After the PDL 30 is formed, a $(1\text{-}1)^{th}$ lift off layer LOL1-1 is formed on the substrate 10. The $(1\text{-}1)^{th}$ lift off layer LOL1-1 has low chemical reactivity with the first intermediate layer 41 that will be formed after a $(1\text{-}1)^{th}$ lift off process to be described below is performed. For example, the $(1\text{-}1)^{th}$ lift off layer LOL1-1 may include a fluoropolymer, as described above.

The $(1\text{-}1)^{th}$ lift off layer LOL1-1 may be formed using a method, such as coating, printing, and deposition. When the $(1\text{-}1)^{th}$ lift off layer LOL1-1 is formed using coating and printing, after curing and/or polymerization is performed, a process of forming a $(1\text{-}1)^{th}$ photoresist layer PR1-1 may be performed as necessary.

The thickness of the $(1\text{-}1)^{th}$ lift off layer LOL1-1 may be 0.2 to 5 When the thickness of the $(1\text{-}1)^{th}$ lift off layer LOL1-1 is too large, the time required for melting the $(1\text{-}1)^{th}$ lift off layer LOL1-1 for patterning increases, and thus, a manufacturing process time may be increased. When the thickness of the $(1\text{-}1)^{th}$ lift off layer LOL1-1 is too small, it is not easy to perform a lift off process.

Subsequently, the $(1\text{-}1)^{th}$ photoresist layer PR1-1 may be formed on the $(1\text{-}1)^{th}$ lift off layer LOL1-1. After a photoresist is coated on the whole $(1\text{-}1)^{th}$ lift off layer LOL1-1, the photoresist in an area that overlaps the first pixel electrode 21 may be exposed and developed using a first photomask (not shown). In this case, the photoresist may be a positive type or negative type. Through the above process, the photoresist in the area that overlaps the first pixel electrode 21 may be removed.

Subsequently, the $(1\text{-}1)^{th}$ lift off layer LOL1-1 may be etched using the patterned $(1\text{-}1)^{th}$ photoresist layer PR1-1 as an etching mask. When the $(1\text{-}1)^{th}$ lift off layer LOL1-1 includes a fluoropolymer, a solvent that may etch the fluoropolymer may be used as an etchant. For example, a $(1\text{-}1)^{th}$ solvent (not shown) including F may be used as the etchant. The $(1\text{-}1)^{th}$ solvent may include hydrofluoroether. Through the etching process, the $(1\text{-}1)^{th}$ lift off layer LOL1-1 formed on the first pixel electrode 21 may be etched.

Through the above etching process, a material used to form the $(1\text{-}1)^{th}$ lift off layer LOL1-1 below an area of the developed photoresist may be removed so that a part of the first pixel electrode 21 and the PDL 30 may be exposed.

Subsequently, the first intermediate layer 41 may be formed on the first pixel electrode 21. Subsequently, the first protective layer 51 may be formed on the first intermediate layer 41 to expose a part of the PDL 30. The first intermediate layer 41 and the first protective layer 51 may be formed by vacuum deposition. In a deposition process, the $(1\text{-}1)^{th}$ lift off layer LOL1-1 and the $(1\text{-}1)^{th}$ photoresist layer PR1-1 function as a mask. By performing a process of depositing the first intermediate layer 41 and the first protective layer 51, a material layer 41X that constitutes the first intermediate layer 41 and a material layer 51X that constitutes the first protective layer 51 may be formed on the $(1\text{-}1)^{th}$ photoresist PR1-1.

Subsequently, a $(1\text{-}1)^{th}$ lift off process may be performed. When the $(1\text{-}1)^{th}$ lift off layer LOL1-1 includes a fluoropolymer, a $(2\text{-}1)^{th}$ solvent including F may be used in a lift off process. Meanwhile, because the lift off process may be performed after the first intermediate layer 41 and the first protective layer 51 are formed, a material having low reactivity with the first intermediate layer 41 may be used in the $(2\text{-}1)^{th}$ solvent. The $(2\text{-}1)^{th}$ solvent may include hydrofluoroether, like in the $(1\text{-}1)^{th}$ solvent.

When the $(1\text{-}1)^{th}$ lift off layer LOL1-1 is removed, the $(1\text{-}1)^{th}$ photoresist layer PR1-1 formed on the $(1\text{-}1)^{th}$ lift off layer LOL1-1, the material layer 41X that constitutes the first intermediate layer 41, and the material layer 51X that constitutes the first protective layer 51 may also be removed together therewith. Through the above-described photo patterning process, i.e., the first unit process, the first intermediate layer 41 and the first protective layer 51 may be formed on the first pixel electrode 21.

Figure 7C:
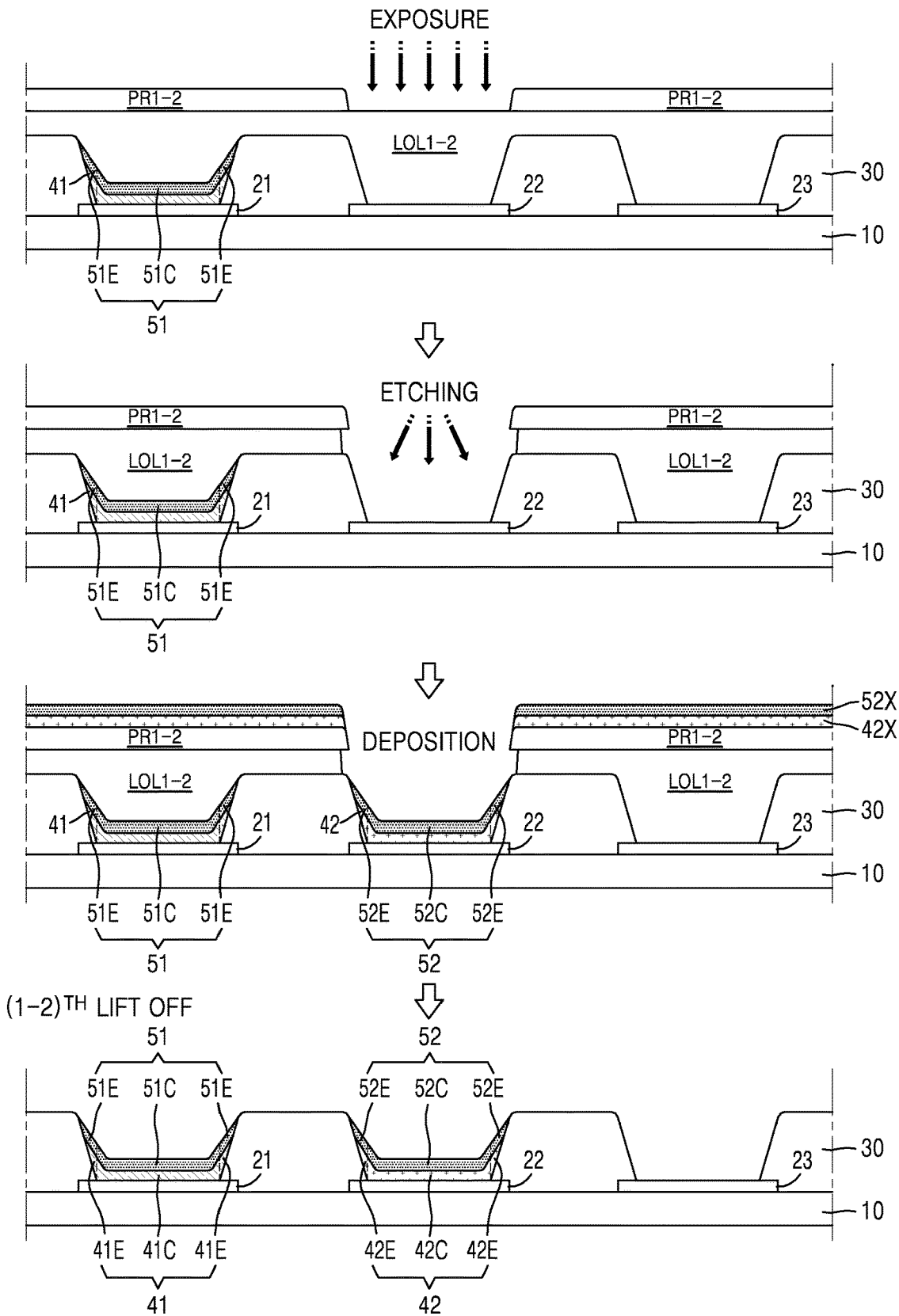

FIG. 7C is a schematic cross-sectional view illustrating a second unit process of forming a second intermediate layer 42 and a second protective layer 52.

After the above-described first unit process is performed, the second unit process of forming the second intermediate layer 42 that emits light of a different color from that of the first intermediate layer 41 may be performed in an area where the second pixel electrode 22 is disposed. Hereinafter, the second unit process will be described based on a difference between the first unit process and the second unit process with reference to FIG. 7C.

Referring to FIG. 7C, a $(1\text{-}2)^{th}$ lift off layer LOL1-2 may be formed on the substrate 10 on which the first, second, and third pixel electrodes 21, 22 and 23 are formed. The $(1\text{-}2)^{th}$ lift off layer LOL1-2 may have low chemical reactivity with the second intermediate layer 42 that will be formed after the $(1\text{-}2)^{th}$ lift off process to be described below is performed. For example, the $(1\text{-}2)^{th}$ lift off process LOL1-2 may include a fluoropolymer. Unlike in the first unit is process, the $(1\text{-}2)^{th}$ lift off layer LOL1-2 may further include a moisture absorbent in addition to the fluoropolymer. The moisture absorbent may prevent deterioration of the first intermediate layer 41 formed in the first unit process by capturing oxygen and moisture that may pass through the $(1\text{-}2)^{th}$ lift off layer LOL1-2.

The moisture absorbent that may be a compound formed by connecting a metal and an oxide, such as calcium oxide, barium oxide, aluminum oxide, or magnesium oxide, may include a material that reacts with water to form a metal hydroxide. Also, the moisture absorbent may include one substance selected from the group consisting of metal halide, metal inorganic acid salt, organic acid salt, a porous inorganic compound, or a combination thereof. The moisture absorbent may include an acryl-based organic material, a methacryl-based organic material, a polyisoprene organic material, a vinyl-based organic material, an epoxy-based organic material, an urethane-based organic material, and a cellulose-based organic material. The moisture absorbent may include titanium oxide, silicon oxide, zirconia, and an alumina-based inorganic material. The moisture absorbent may include a sealant formed of epoxy silane, vinyl silane, amine silane, and methacrylate silane.

Subsequently, a $(1\text{-}2)^{th}$ photoresist layer PR1-2 is formed on the $(1\text{-}2)^{th}$ lift off layer LOL1-2. After a photoresist is coated on the whole $(1\text{-}2)^{th}$ lift off layer LOL1-2, the photoresist in an area that overlaps the second pixel electrode 22 may be exposed and developed using a second photomask (not shown). Through the above process, the photoresist in the area that overlaps the second pixel electrode 22 may be removed.

Subsequently, the $(1\text{-}2)^{th}$ lift off layer LOL1-2 may be etched using a pattern of the $(1\text{-}2)^{th}$ photoresist layer PR1-1 as an etching mask. When the $(1\text{-}2)^{th}$ lift off layer LOL1-2 includes a fluoropolymer, a solvent that may etch the fluoropolymer may be used as an etchant. A $(1\text{-}2)^{th}$ solvent (not shown) may be used as the etchant. The $(1\text{-}2)^{th}$ solvent may include hydrofluoroether, like in the above-described first unit process. A different material from a material used in the above-described first unit process may also be used in the $(1\text{-}2)^{th}$ solvent.

Through the above etching process, the $(1\text{-}2)^{th}$ lift off layer LOL1-2 formed on the second pixel electrode 22 may be etched. Thus, a material used to form the $(1\text{-}2)^{th}$ lift off layer LOL1-2 below an area of the developed photoresist may be removed so that a part of the second pixel electrode 22 and the PDL 30 may be exposed.

The second intermediate layer 42 may be formed on the second pixel electrode 22. The second protective layer 52 may be formed on the second intermediate layer 42 to expose a part of the PDL 30.

The second intermediate layer 42 and the second protective layer 52 may be formed by vacuum deposition. By performing a process of depositing the second intermediate layer 42 and the second protective layer 52, the material layer 42X that constitutes the second intermediate layer 42 and the material layer 52X that constitutes the second protective layer 52 may be formed on the $(1\text{-}2)^{th}$ photoresist layer PR1-2.

Subsequently, a $(1\text{-}2)^{th}$ lift off process may be performed. When the $(1\text{-}2)^{th}$ lift off layer LOL1-2 includes fluoropolymer, a $(2\text{-}2)^{th}$ solvent including F may be used in the lift off process. Because the lift off process may be performed after the second intermediate layer 42 and the second protective layer 52 are formed, a material having low reactivity with the second intermediate layer 42 may be used in the $(2\text{-}2)^{th}$ solvent. The $(2\text{-}2)^{th}$ solvent may include hydrofluoroether, like in the $(1\text{-}2)^{th}$ solvent.

When the $(1\text{-}2)^{th}$ lift off layer LOL1-2 is removed, the $(1\text{-}2)^{th}$ photoresist layer PR1-2 formed thereon, the material layer 42X that constitutes the second intermediate layer 42, and the material layer 52X that constitutes the second protective layer 52 may also be removed together therewith. Through the above-described photo patterning process, i.e., the second unit process, the second intermediate layer 42 and the second protective layer 52 may be formed on the second pixel electrode 22.

Figure 7D:
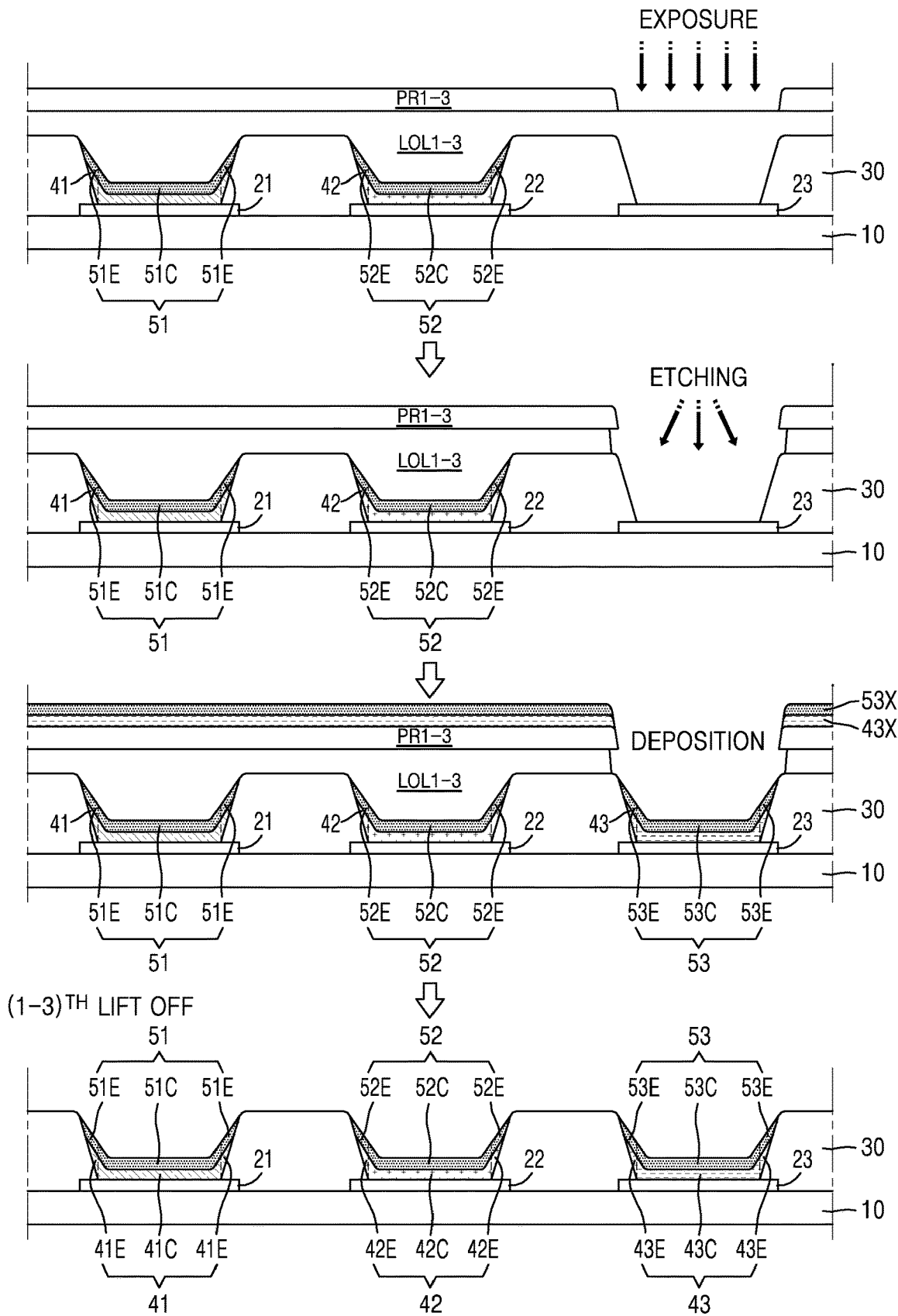

FIG. 7D is a schematic cross-sectional view illustrating a third unit process of forming a third intermediate layer 43 and a third protective layer 53.

After the above-described second unit process is performed, a third unit process of forming a third intermediate layer 43 that emits light of a different color from those of the first intermediate layer 41 and the second intermediate layer 42 may be performed in an area where the third pixel electrode 23 is disposed. Hereinafter, the third unit process will be described with reference to FIG. 7D.

Referring to FIG. 7D, a $(1\text{-}3)^{th}$ lift off layer LOL1-3 is formed on the substrate 10 on which the first, second, and third pixel electrodes 21, 22 and 23 are formed. The $(1\text{-}3)^{th}$ lift off layer LOL1-3 may have chemical reactivity with the third intermediate layer 43 to be formed after a $(1\text{-}3)^{th}$ lift off process that will be described below is performed. For example, the $(1\text{-}3)^{th}$ lift off layer LOL1-3 may include a fluoropolymer. Unlike in the first unit process, the $(1\text{-}3)^{th}$ lift off layer LOL1-3 may further include a moisture absorbent in addition to the fluoropolymer. The moisture absorbent may prevent deterioration of the first intermediate layer 41 and the second intermediate layer 42 formed in the first unit process and the second process by capturing oxygen and moisture that passed through the $(1\text{-}3)^{th}$ lift off layer LOL1-3. The moisture absorbent may be as described above.

Subsequently, a $(1\text{-}3)^{th}$ photoresist layer PR1-3 may be formed on the $(1\text{-}3)^{th}$ lift off layer LOL1-3. After a photoresist is coated on the whole $(1\text{-}3)^{th}$ lift off layer LOL1-3, the photoresist in an area that overlaps the third pixel electrode 23 may be exposed and developed using a third photomask (not shown). Through the above process, the photoresist in the area that overlaps the third pixel electrode 23 may be removed.

Subsequently, the $(1\text{-}3)^{th}$ lift off layer LOL1-3 may be etched using a pattern of the $(1\text{-}3)^{th}$ photoresist layer PR1-3 as an etching mask. When the $(1\text{-}3)^{th}$ lift off layer LOL1-3 includes a fluoropolymer, a solvent that may etch the fluoropolymer may be used as an etchant. A $(1\text{-}3)^{th}$ solvent (not shown) including F may be used as the etchant. The $(1\text{-}3)^{th}$ solvent may include hydrofluoroether, like in the above-described first unit process. A different material from a material used in the above-described first unit process and second unit process may also be used in the $(1\text{-}3)^{th}$ solvent.

Through the above etching process, the $(1\text{-}3)^{th}$ lift off layer LOL1-3 formed on the third pixel electrode 23 may be etched. Thus, a material used to form the $(1\text{-}3)^{th}$ lift off layer LOL1-3 below an area of the developed photoresist may be removed so that a part of the third pixel electrode 23 and the PDL 30 may be exposed.

The third intermediate layer 43 may be formed on the third pixel electrode 23. The third protective layer 53 may be formed on the third intermediate layer 43 to expose a part of the PDL 30. The third intermediate layer 43 and the third protective layer 53 may be formed by vacuum deposition.

By performing a process of depositing the third intermediate layer 43 and the third protective layer 53, a material layer 43X that constitutes the third intermediate layer 43 and a material layer 53X that constitutes the third protective layer 53 may be formed on the $(1\text{-}3)^{th}$ photoresist layer PR1-3.

Subsequently, the $(1\text{-}3)^{th}$ lift off process may be performed. When the $(1\text{-}3)^{th}$ lift off layer LOL1-3 includes a fluoropolymer, a $(2\text{-}3)^{th}$ solvent including F may be used in the lift off process. Because the lift off process may be performed after the third intermediate layer 43 and the third protective layer 53 are formed, a material having low reactivity with the third intermediate layer 43 may be used in the $(2\text{-}3)^{th}$ solvent. The $(2\text{-}3)^{th}$ solvent may include hydrofluoroether, like in the $(1\text{-}3)^{th}$ solvent.

When the $(1\text{-}3)^{th}$ lift off layer LOL1-3 is removed, the $(1\text{-}3)^{th}$ photoresist layer PR1-3 formed thereon, the material layer 43X that constitutes the third intermediate layer 43, and the material layer 53X that constitutes the third protective layer 53 may also be removed together therewith. Through the above-described photo patterning process, i.e., the third unit process, the third intermediate layer 43 and the third protective layer 53 may be formed on the third pixel electrode 23.

Figure 7E:
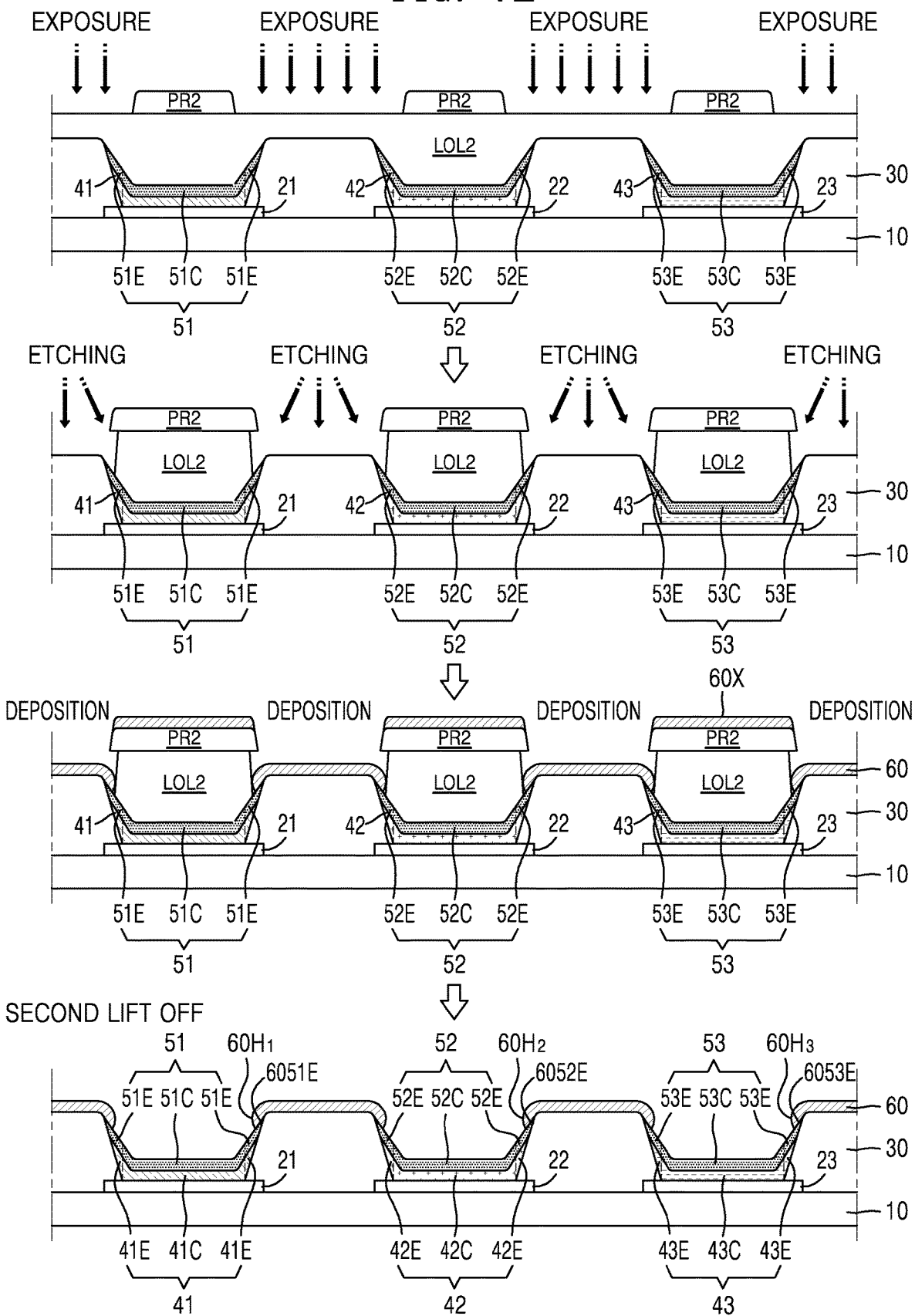

FIG. 7E is a schematic cross-sectional view illustrating a process of forming the opposite electrode 60.

Referring to FIG. 7E, a second lift off layer LOL2 may be formed on the substrate 10 on which the first, second, and third intermediate layers 41, 42, and 43 and the first, second, and third protective layers 51, 52, and 53 are formed. The second lift off layer LOL2 may have chemical reactivity with the first, second, and third intermediate layers 41, 42, and 43. For example, the second lift off layer LOL2 may include a fluoropolymer having low chemical reactivity with materials used to form the first, second, and third intermediate layers 41, 42, and 43. The fluoropolymer may be as described above.

The second lift off layer LOL2 may be formed using a method, such as coating, printing, and deposition. When the second lift off layer LOL2 is formed by coating and printing, after curing and/or polymerization is performed, a process of forming the second photoresist layer PR2 may be performed as necessary.

Subsequently, a second photoresist layer PR2 may be formed on the second lift off layer LOL2. After a photoresist is coated on the whole second lift off layer LOL2, the photoresist in an area that overlaps the PDL 30 may be exposed and developed using a photomask (not shown). In this case, the photoresist may be a positive type or negative type. Through the above process, the photoresist in the area that overlaps the PDL 30 may be removed so that the second photoresist layer PR2 is formed.

Subsequently, the second lift off layer LOL2 may be etched using the patterned second photoresist layer PR2 as an etching mask. When the second lift off layer LOL2 includes a fluoropolymer, a solvent that may etch the fluoropolymer may be used as an etchant. For example, a third solvent (not shown) including F may be used as the etchant. The third solvent may include hydrofluoroether.

Through the above etching process, a material used to form the second lift off layer LOL2 below an area of the developed photoresist may be removed so that a part of the PDL 30 and at least a part of the protective layer edge portion 50E may be exposed.

Subsequently, the opposite electrode 60 may be formed on the PDL 30, at least a part of the first protective layer edge portion 51E, at least a part of the second protective layer edge portion 52E, at least a part of the third protective layer edge portion 53E, and the second photoresist layer PR2.

In this case, a material layer 60X that constitutes the opposite electrode 60 may be formed on the second photoresist layer PR2.

According to an exemplary embodiment, the opposite electrode 60 may cover at least a part of the first protective layer edge portion 51E, at least a part of the second protective layer edge portion 51E, and at least a part of the third protective layer edge portion 53E.

Subsequently, the second lift off layer LOL2 and the second photoresist layer PR2 may be removed using a stripper. For example, when the second lift off layer LOL2 includes a fluoropolymer, a fourth solvent (not shown) including F may be used as the stripper. In this case, a material having low chemical reactivity with the first, second, and third intermediate layers 41, 42, and 43 may be used in the fourth solvent. The fourth solvent may include hydrofluoroether, like in the third solvent.

When the second lift off layer LOL2 is removed, the second photoresist layer PR2 formed on the second lift off layer LOL2 and the material layer 60X that constitutes the opposite electrode 60 may be removed. Through the photo patterning process, the opposite electrode 60 may be formed on at least a part of the PDL 30 and the first protective layer edge portion 51E, at least a part of the second protective layer edge portion 52E, and at least a part of the third protective layer edge portion 53E. In this case, the opposite electrode 60 may include a first opening 60H1 exposing at least a part of the first protective layer 51, a second opening 60H2 exposing at least a part of the second protective layer 52, and a third opening 60H3 exposing at least a part of the third protective layer 53.

According to an exemplary embodiment, the opposite electrode 60 may be formed in such a way that an opening of the opposite electrode 60 may include the first opening 60H1 exposing the first protective layer central portion 51C, the second opening 60H2 exposing the second protective layer central portion 52C, and the third opening 60H3 exposing the third protective layer central portion 53C. If the opposite electrode 60 contacts the first, second, and third protective layer central portions 51C, 52C, and 53C of the first, second, and third protective layers 51, 52, and 53, poor driving may occur due to the residual layer between the opposite electrode 60 and the first, second, and third protective layers 51, 52, and 53, and accordingly, luminous efficiency may be lowered.

According to an exemplary embodiment, the opposite electrode 60 may be formed to include the areas 6051E, 6052E, and 6053E that directly contact the first protective layer edge portion 51E, the second protective layer edge portion 52E, and the third protective layer edge portion 53E, respectively.

According to an exemplary embodiment, the opposite electrode 60 may be formed to include the areas 6051E, 6052E, and 6053E that contact the first protective layer edge portion 51E, the second protective layer edge portion 52E and the third protective layer edge portion 53E directly, so that the outer edge boundary line 51EOB of the first protective layer edge portion 51E, the outer edge boundary line 52EOB of the second protective layer edge portion 52E, and the outer edge boundary line 53EOB of the third protective layer edge portion 53E may not be exposed. When the opposite electrode 60 covers only a part of the outer edge boundary lines 51EOB, 52EOB, and 53EOB of the first, second, and third protective layer edge portions 51E, 52E, and 53E, the opposite electrode 60 and the first, second, and third protective layer edge portions 51E, 52E, and 53E may be electrically connected to each other. However, resistance may be generated in an area where the opposite electrode 60 and the first, second, and third protective layer edge portions 51E, 52E, and 53E do not overlap.

As described above, according to the embodiments, the thickness of the opposite electrode 60 may be adjusted so that a resistance of the opposite electrode 60 can be controlled, and the protective layer 50 may have a uniform thickness so that light characteristics in an emission area may be maintained and a problem related to the light characteristics lowered due to the residual layer between the protective layer 50 and the opposite electrode 60 can be reduced.

As described above, according to one or more embodiments, an organic light-emitting display apparatus that may reduce or eliminate a problem related to light characteristics lowered due to a residual layer between a protective layer and an opposite electrode, and a method of manufacturing the same may be provided. However, the scope of embodiments is not limited by these effects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
   forming a pixel electrode on a substrate;
   forming a pixel-defining layer (PDL) having an opening exposing at least a part of the pixel electrode;
   forming an intermediate layer comprising a central portion disposed on the pixel electrode, an edge portion that extends from the central portion and contacts the PDL, at least one common layer, and an organic emission layer;
   forming a protective layer comprising a central portion disposed on the central portion of the intermediate layer and an edge portion that extends from the central portion of the protective layer and contacts the PDL, wherein a portion of the edge portion of the protective layer is disposed farther away from the substrate than the central portion of the protective layer;
   forming an opposite electrode on the PDL, the opposite electrode having an opening exposing the central portion of the protective layer and electrically connected to the protective layer,
   wherein the opposite electrode comprises an area that covers at least a part of the edge portion of the protective layer and contacts the edge portion of the protective layer directly, and
   wherein the opposite electrode directly contacts with the PDL.

2. The method of claim 1, wherein the forming of the intermediate layer and the forming of the protective layer comprise:
   forming a first lift off layer on the PDL;
   forming a first photoresist layer on the first lift off layer;
   patterning the first photoresist layer;
   etching the first lift off layer using the patterned first photoresist layer as a mask to expose the pixel electrode;
   depositing a first material to form the intermediate layer on the pixel electrode exposed by the first lift off layer and the first photoresist layer;
   depositing a second material to form the protective layer on the intermediate layer exposed by the first lift off layer and the first photoresist layer; and
   removing the first lift off layer and the first photoresist layer.

3. The method of claim 1, wherein the forming of the opposite electrode comprises:
   forming a second lift off layer on the PDL and the protective layer after the forming of the protective layer;
   forming a second photoresist layer on the second lift off layer;
   patterning the second photoresist layer;
   etching the second lift off layer exposed by the patterned second photoresist layer to expose at least a part of the PDL and the edge portion of the protective layer;
   forming the opposite electrode comprising an area that contacts the edge portion of the protective layer on at least a part of the PDL; and
   removing the second lift off layer and the second photoresist layer.

4. The method of claim 1, wherein a thickness of the organic emission layer of the edge portion of the intermediate layer gradually decreases as the organic emission layer extends away from the central portion of the intermediate layer.

5. The method of claim 1, wherein:
   the protective layer and the opposite electrode comprise a same conductive material, and
   the same conductive material comprises at least one of aluminum (Al), magnesium (Mg), lithium (Li), calcium (Ca), copper (Cu), LiF/Ca, LiF/Al, MgAg, and CaAg.

6. The method of claim 1, wherein the protective layer comprises a conductive organic material.

7. The method of claim 1, further comprising:
   forming a capping layer disposed on the protective layer and the opposite electrode after the forming of the opposite electrode.

8. The method of claim 1, wherein:
   the forming of the pixel electrode on the substrate comprises forming a first pixel electrode, a second pixel electrode, and a third pixel electrode on the substrate and spaced apart from each other,
   the forming of the intermediate layer and the forming of the protective layer comprise:
   depositing a first intermediate layer, configured to emit light of a first color, on the first pixel electrode;
   depositing a first protective layer on the first intermediate layer;
   depositing a second intermediate layer, configured to emit light of a second color, on the second pixel electrode;
   depositing a second protective layer on the second intermediate layer;
   depositing a third intermediate layer, configured to emit light of a third color, on the third pixel electrode; and
   depositing a third protective layer on the third intermediate layer,
   the first intermediate layer, the second intermediate layer, and the third intermediate layer are spaced apart from each other, and
   the first protective layer, the second protective layer, and the third protective layer are spaced apart from each other.

9. The method of claim 8, wherein the forming of the opposite electrode comprises forming the opposite electrode having a first opening exposing a central portion of the first protective layer, a second opening exposing a central portion of the second protective layer, and a third opening exposing a central portion of the third protective layer.

* * * * *